United States Patent
Kim et al.

(10) Patent No.: US 11,189,669 B2
(45) Date of Patent: Nov. 30, 2021

(54) DISPLAY APPARATUS HAVING A FLEXIBLE CIRCUIT BOARD FOR DRIVING A SHUTTER FILM AND METHOD OF MANUFACTURING THEREOF

(71) Applicant: Samsung Display Co., Ltd., Yongin-Si (KR)

(72) Inventors: Jae-Hyun Kim, Asan-si (KR); Jin-Oh Kwag, Suwon-si (KR); Yong-Kyu Jang, Hwaseong-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/868,468

(22) Filed: May 6, 2020

(65) Prior Publication Data
US 2020/0266251 A1    Aug. 20, 2020

Related U.S. Application Data

(62) Division of application No. 15/707,419, filed on Sep. 18, 2017, now Pat. No. 10,672,841.

(30) Foreign Application Priority Data

Nov. 18, 2016  (KR) .......................... 10-2016-0153949

(51) Int. Cl.
  *H01L 27/32*   (2006.01)
  *G09G 3/3258*  (2016.01)
  *H01L 51/56*   (2006.01)

(52) U.S. Cl.
  CPC ....... *H01L 27/3232* (2013.01); *G09G 3/3258* (2013.01); *H01L 27/326* (2013.01); *H01L 27/3211* (2013.01); *H01L 27/3246* (2013.01); *H01L 27/3258* (2013.01); *H01L 51/56* (2013.01); *G09G 2300/08* (2013.01); *H01L 2227/323* (2013.01)

(58) Field of Classification Search
  CPC .................................................. H01L 27/3232
  USPC .......................................................... 345/82
  See application file for complete search history.

(56) References Cited

U.S. PATENT DOCUMENTS

2008/0316397 A1*  12/2008  Polak ................ G02F 1/133536
                                                    349/97
2011/0249211 A1   10/2011  Song et al.
2012/0306562 A1*  12/2012  Miyamoto ............. G09G 3/346
                                                    327/434
(Continued)

FOREIGN PATENT DOCUMENTS

KR   10-2014-0087592 A   7/2014
KR   10-2015-0028128 A   3/2015
KR   10-2015-0063773 A   6/2015

*Primary Examiner* — Long D Pham
(74) *Attorney, Agent, or Firm* — Innovation Counsel LLP

(57) ABSTRACT

A display apparatus includes a first substrate and a second substrate opposing to the first substrate. The first substrate includes a transmission area in which a shutter unit is disposed and an emission area in which an organic light emitting diode is disposed. The shutter unit includes a first shutter electrode, a second shutter electrode, and a shutter layer interposed between the first and second shutter electrodes. The organic light emitting diode includes a pixel electrode, a common electrode, and a light-emitting layer interposed between the pixel and common electrodes. At least one of the first and second shutter electrodes is connected to the common electrode of the organic light emitting diode.

3 Claims, 23 Drawing Sheets

(56) References Cited

U.S. PATENT DOCUMENTS

| | | |
|---|---|---|
| 2012/0327331 A1 | 12/2012 | Yim et al. |
| 2014/0168572 A1* | 6/2014 | Iwata .................... H05B 33/10 349/61 |
| 2015/0168776 A1 | 6/2015 | Song et al. |
| 2015/0316690 A1 | 11/2015 | Tamada et al. |
| 2016/0204175 A1 | 7/2016 | Kim et al. |

* cited by examiner

<TRANSPARENT MODE>

<OPAQUE MODE>

DISPLAY APPARATUS HAVING A FLEXIBLE CIRCUIT BOARD FOR DRIVING A SHUTTER FILM AND METHOD OF MANUFACTURING THEREOF

This application is a divisional application of U.S. patent application Ser. No. 15/707,419 filed on Sep. 18, 2017, which claims priority to and the benefit of Korean Patent Application No. 10-2016-0153949 filed on Nov. 18, 2016, the disclosures of which are hereby incorporated by reference in their entirety.

BACKGROUND OF THE INVENTION

1. Field of the Invention

Exemplary embodiments of the inventive concept relate to a display apparatus and a method of manufacturing the display apparatus. More particularly, exemplary embodiments of the inventive concept relate to a display apparatus having an improved display quality and a method of manufacturing the display apparatus.

2. Description of the Related Art

A flat panel display (FPD) device is widely used as a display device of an electronic device for its lightweight and thinness compared to a cathode-ray tube (CRT) display device. Typical examples of the FPD device are a liquid crystal display (LCD) device and an organic light emitting display (OLED) device. Compared to the LCD device, the OLED device has several advantages such as a higher luminance and a wider viewing angle. In addition, the OLED device can be made thinner because the OLED device does not require a backlight. In the OLED device, electrons and holes are injected into an organic thin layer through a cathode and an anode, and recombined in the organic thin layer to generate excitons, thereby emitting a light of a certain wavelength.

Recently, a transparent display device that is capable of transmitting an image of an object (or target) that is displayed in a rear (or at the back) of the display device by including a transparent region and a pixel region has been developed.

BRIEF SUMMARY OF THE INVENTION

Exemplary embodiments of the inventive concept provide a display apparatus having improved visibility.

Exemplary embodiments of the inventive concept provide a method of manufacturing the display apparatus.

According to an exemplary embodiment, the display apparatus includes a first substrate and a second substrate opposing to the first substrate. The first substrate includes a transmission area in which a shutter unit is disposed and an emission area in which an organic light emitting diode is disposed. The shutter unit includes a first shutter electrode, a second shutter electrode, and a shutter layer interposed between the first and second shutter electrodes. The organic light emitting diode includes a pixel electrode, a common electrode, and a light-emitting layer interposed between the pixel and common electrodes At least one of the first and second shutter electrodes is connected to the common electrode of the organic light emitting diode.

In an exemplary embodiment, the display apparatus may further include a pixel circuit disposed in the emission area of the first substrate and connected to the organic light emitting diode.

In an exemplary embodiment, the display apparatus may further include a first base substrate and a buffer layer disposed on the first base substrate, wherein the pixel circuit and the organic light emitting diode may be disposed on the buffer layer in the emission area, and the shutter unit may be disposed in an opening that exposes the buffer layer in the transmission area.

In an exemplary embodiment, the first shutter electrode may be disposed on the buffer layer in the transmission area, and the first shutter electrode may be connected to the common electrode.

In an exemplary embodiment, the shutter unit may be configured to be driven in a transparent mode or an opaque mode based on a driving voltage applied to the second shutter electrode.

In an exemplary embodiment, the second shutter electrode may be disposed on the shutter layer in the transmission area and the second shutter electrode may be connected to the common electrode.

In an exemplary embodiment, the common electrode may include a first transparent conductive layer and a second transparent conductive layer, the second shutter electrode formed that is using the second transparent conductive layer.

In an exemplary embodiment, the shutter unit may be configured to be driven in a transparent mode or an opaque mode based on a driving voltage applied to the first shutter electrode.

According to an exemplary embodiment of the inventive concept, there is provided a display apparatus. The display apparatus includes a first substrate and a second substrate opposing to the first substrate. The first substrate includes a transmission area in which a shutter unit is disposed and an emission area in which an organic light emitting diode is disposed. The shutter unit includes a first shutter electrode, a second shutter electrode, and a shutter layer interposed between the first and second shutter electrodes. The organic light emitting diode includes a pixel electrode, a common electrode, and a light-emitting layer interposed between the pixel and common electrodes.

In an exemplary embodiment, the display apparatus may further include a pixel circuit disposed in the emission area of the first substrate and connected to the organic light emitting diode.

In an exemplary embodiment, the first substrate may further include a first base substrate and a buffer layer disposed on the first base substrate, wherein the pixel circuit and the organic light emitting diode are disposed on the buffer layer in the emission area and the shutter unit is disposed in an opening that exposes the buffer layer in the transmission area.

In an exemplary embodiment, the first shutter electrode may be disposed on the buffer layer in the transmission area, and the second shutter electrode may be disposed on the shutter layer.

In an exemplary embodiment, the first shutter electrode may be disposed on the buffer layer in the transmission area, the second shutter electrode may be disposed on the shutter layer, and the common electrode in the emission area may include a first transparent conductive layer and a second transparent conductive layer, wherein the second shutter electrode may be formed using the second transparent electrode layer.

According to an exemplary embodiment of the inventive concept, there is provided a display apparatus. The display apparatus includes a display panel comprising a first substrate and a second substrate opposing to the first substrate, a shutter film, a main driving circuit, a first flexible circuit, and a second flexible circuit. The display panel includes a transmission area transmitting a light and an emission area in which a pixel circuit and an organic light emitting diode connected to the pixel circuit are disposed. The shutter film includes a first shutter electrode, a second shutter electrode, and a shutter layer disposed between the first and second shutter electrodes and is disposed on a second surface of the first substrate. The main driving circuit is configured to generate a panel driving voltage to drive the display panel and a shutter driving voltage to drive the shutter film. The first flexible circuit board includes a first area that is disposed on a first surface of the first substrate and a second area that is disposed on a second surface of the first substrate, and is configured to transfer the panel driving voltage to the display panel. The second flexible circuit board is connected to the first flexible circuit board and the shutter film, and configured to transfer the shutter driving voltage to the shutter film.

In an exemplary embodiment, the display apparatus may further include a printed circuit board on which the main driving circuit is mounted and disposed on the second surface of the first substrate, wherein the first flexible circuit board connects the printed circuit board and the display panel, and the second flexible circuit board connects the printed circuit board and the shutter film.

In an exemplary embodiment, the main driving circuit may be mounted on the first flexible circuit board, a first end portion of the first flexible circuit board may be connected to the display panel, and a second end portion of the first flexible circuit board may be connected to the first flexible circuit board.

According to an exemplary embodiment of the inventive concept, there is provided a method of manufacturing a display apparatus. The method includes forming a pixel circuit that includes a plurality of metal patterns and a plurality of insulating layers between the plurality of metal patterns, in an emission area of a base substrate, etching the plurality of insulating layers in a transmission area of the base substrate to form an opening, forming a pixel electrode of an organic light emitting diode on the pixel circuit in the emission area and a first shutter electrode in the opening of the transmission area, forming a light-emitting layer on the pixel electrode in the emission area, forming a shutter layer on the first shutter electrode in the transmission area and forming a common electrode of the organic light emitting diode on the light-emitting layer and a second shutter electrode of the shutter unit on the shutter layer, the common electrode connected to the second shutter electrode.

In an exemplary embodiment, the method may further include forming a first transparent conductive layer, a metal layer and a second transparent conductive layer on the base substrate on which the pixel circuit is disposed, forming a first photoresist pattern having a first thickness on a pixel electrode layer in the emission area and a second photoresist pattern having a second thickness thinner than a first thickness on the pixel electrode layer in the transmission area, forming the pixel electrode in the emission area and an electrode pattern in the transmission area using the first and second photoresist patterns, etching the first and second photoresist patterns by a predetermined thickness to form a third photoresist pattern on the pixel electrode, the predetermined thickness being larger than the second thickness, and etching the second transparent conductive layer and the metal layer of the electrode pattern using the third photoresist pattern to form the first shutter electrode from the first transparent conductive layer.

In an exemplary embodiment, the method may further include forming a transparent conductive layer on the light-emitting layer and the shutter layer, and patterning the transparent conductive layer to form the common electrode of the organic light emitting diode and the second shutter electrode that is electrically disconnected and spaced apart from the common electrode.

According to an exemplary embodiment of the inventive concept, there is provided a method of manufacturing a display apparatus. The method includes forming a pixel circuit that including a plurality of metal patterns and a plurality of insulating layers between the plurality of metal patterns, in an emission area of a base substrate, etching the plurality of insulating layers in a transmission area of the base substrate to form an opening, forming a pixel electrode and a light-emitting layer on the pixel circuit in the emission area, forming a common electrode on the light-emitting layer in the emission area and a first shutter electrode of a shutter unit in the opening of the transmission area, the common electrode being connected to the first shutter electrode, forming a shutter layer on the first shutter electrode in the transmission area, and forming a second shutter electrode on the shutter layer in the transmission area.

According to an exemplary embodiment of the inventive concept, there is provided a method of manufacturing a display apparatus. The method includes forming a pixel circuit that includes a plurality of metal patterns and a plurality of insulating layers between the plurality of metal patterns, in an emission area of a base substrate, etching the plurality of insulating layer in a transmission area of the base substrate to form an opening, forming a pixel electrode and a light-emitting layer on the pixel circuit in the emission area, forming a first transparent conductive layer on the light-emitting layer in the emission area and in the opening of the transmission area, patterning the transparent conductive layer to form a common electrode of an organic light emitting diode in the emission area and a first shutter electrode of a shutter unit in the transmission area, wherein the common electrode of the organic light emitting diode and the first shutter electrode of the shutter unit are electrically disconnected and spaced apart from each other, forming a shutter layer on the first shutter electrode in the transmission area, and forming a second transparent conductive layer on the shutter layer in the transmission area and on the common electrode in the emission area.

In an exemplary embodiment, the method may further include patterning the second transparent conductive layer to form a second shutter electrode of the shutter unit on the shutter layer in the transmission area, wherein the second shutter electrode of the shutter unit and the common electrode of the organic light emitting diode are separated from each other.

In an exemplary embodiment, the method may further include patterning the second transparent conductive layer to form the common electrode, wherein the common electrode includes the first and second transparent conductive layers in the emission area and a second shutter electrode of the shutter unit that is electrically disconnected and spaced apart from the common electrode in the transmission area.

In an exemplary embodiment, the method may further include patterning the second transparent conductive layer to expose the first transparent conductive layer in the emission area and a second shutter electrode of the shutter unit in the transmission area.

According to the inventive concept, in an indoor environment in which intensity of the external light is relatively low, the transmission area of the display apparatus may be driven in the transparent mode so that the transmission area may transmit the external light to improve the luminance of the light emitted from the emission area. However, in an outdoor environment in which intensity of the external light is relatively high, the transmission area of the display apparatus may be driven in the opaque mode so that the transmission area may block the external light to prevent the external light from being mixed with the light emitted from the emission area to improve the visibility of the image displayed on the display apparatus.

BRIEF DESCRIPTION OF THE DRAWINGS

The above and other features and advantages of the inventive concept will become more apparent by describing in detailed exemplary embodiments thereof with reference to the accompanying drawings, in which.

DETAILED DESCRIPTION OF THE INVENTION

Hereinafter, the inventive concept will be explained in detail with reference to the accompanying drawings.

Figure 1:
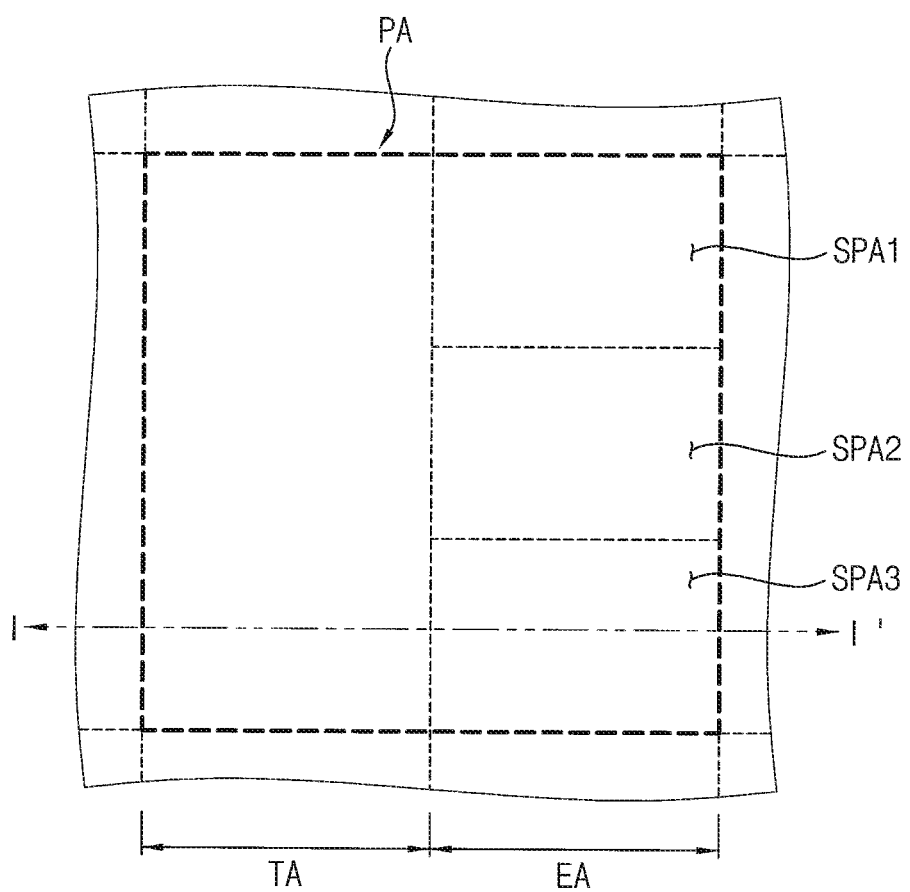
FIG. 1 is a plan view illustrating a pixel area of a display apparatus according to an exemplary embodiment.

FIG. 1 is a plan view illustrating a pixel area of a display apparatus according to an exemplary embodiment.

Referring to FIG. 1, the display apparatus may include a plurality of pixel areas PA. Each of the pixel area PA may include a transmission area TA and an emission area EA. The emission area EA may include a plurality of subpixel areas SPA1, SPA2, and SPA3.

The transmission area TA may be defined by an opening area in which a plurality of insulating layers is etched. The opening area may also be referred to as a transmission window TW. A shutter unit may be disposed in the transmission area TA to control an intensity of a light transmitted through the transmission window TW. For example, the shutter unit in the transmission area TA may transmit or block the light.

As shown in FIG. 1, the transmission area TA may correspond to all of the first, second and third subpixel areas SPA1, SPA2 and SPA3. Alternatively, not shown in FIG. 1 and other figures, the transmission area TA may correspond to each of the first, second and third subpixel areas SPA1, SPA2 and SPA3.

The transmission area TA may be planar having a substantially square shape (or a substantially rectangular shape), but the present disclosure is not limited thereto. For example, the transmission area TA may be planar having a substantially triangle shape, a substantially diamond shape, a substantially polygonal shape, a substantially circular shape, a substantially track shape, or a substantially elliptical shape.

The emission area EA may include first, second and third subpixel areas SPA1, SPA2 and SPA3. The first, second and third subpixels may be disposed in the first, second and third subpixel areas SPA1, SPA2 and SPA3, respectively. The first subpixel may emit a red color, the second subpixel may emit a green color, and the third subpixel may emit a blue color.

A pixel defining layer may be disposed to define an OLED area in each of the first, second and third subpixel areas SPA1, SPA2 and SPA3. An anode electrode, a light-emitting layer, and a cathode electrode of an organic light emitting diode (OLED) may be disposed in the OLED area in each of the first, second and third subpixel areas SPA1, SPA2 and SPA3. A pixel circuit may be disposed under the pixel defining layer to drive the organic light emitting diode. The pixel circuit may include a scan line, a data line, a power source voltage, a first transistor, a second transistor, a storage capacitor, etc.

The subpixel area illustrated in FIG. 1 may be planar having a substantially square shape (or a substantially rectangular shape), but the present disclosure is not limited thereto. For example, the subpixel area may be planar having a substantially triangle shape, a substantially diamond shape, a substantially polygonal shape, a substantially circular shape, a substantially track shape, or a substantially elliptical shape.

Figure 2:
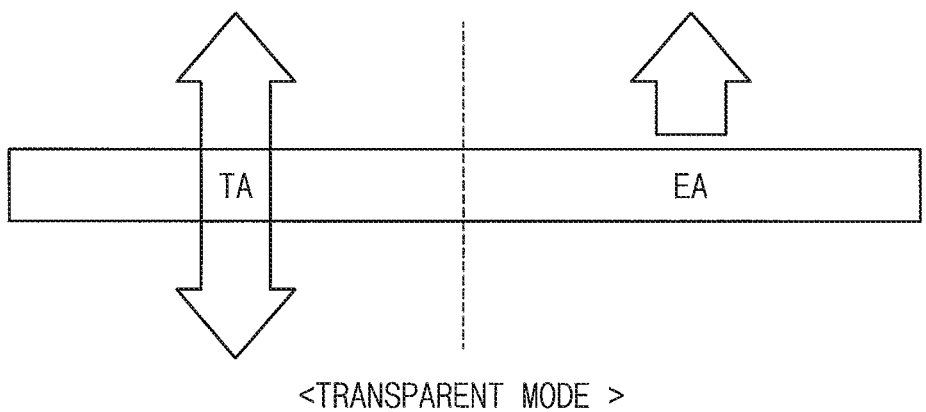
FIG. 2 is a conceptual diagram illustrating a transparent mode of the pixel area shown in FIG. 1.
Figure 3:
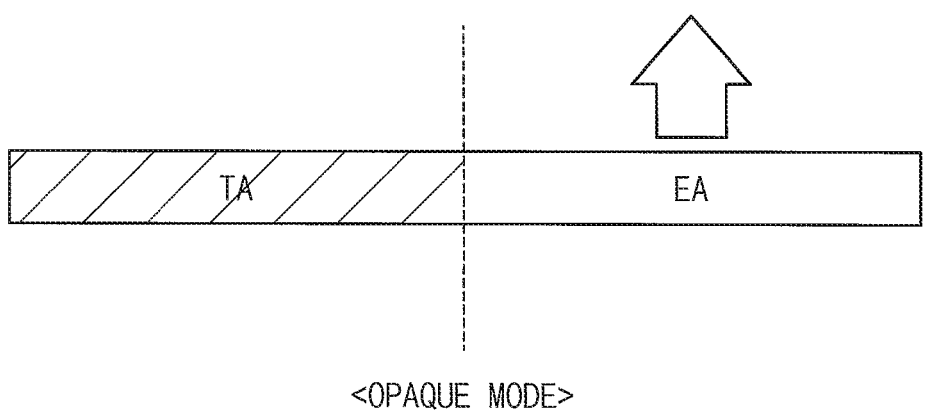
FIG. 3 is a conceptual diagram illustrating an opaque mode of the pixel area shown in FIG. 1.

FIG. 2 is a conceptual diagram illustrating a transparent mode of the pixel area PA shown in FIG. 1. FIG. 3 is a conceptual diagram illustrating an opaque mode of the pixel area PA shown in FIG. 1.

Referring to FIGS. 2 and 3, the transmission area TA may transmit an external light in a transparent mode, and the emission area EA may emit a light corresponding to an image.

For example, in an indoor environment with an external light of low intensity, the transmission area TA of the display apparatus may be driven in the transparent mode. The display apparatus may transmit an external light through the transmission area TA so that a luminance of the light corresponding to the image emitted from the emission area EA may be increased by the transmitted external light.

However, in an outdoor environment with an external light of high intensity, the light corresponding to the image emitted from the emission area EA may be mixed with an external light reflected from a surface of the display apparatus so that a visibility of the image displayed on the display apparatus may be decreased.

According to the exemplary embodiment, in the outdoor environment, the transmission area TA of the display apparatus may be driven in an opaque mode. In the opaque mode, the transmission area TA may block the external light, and the emission area EA may emit the light corresponding to the image. Therefore, the display apparatus may increase the visibility of the image in the outdoor environment.

Figure 4:
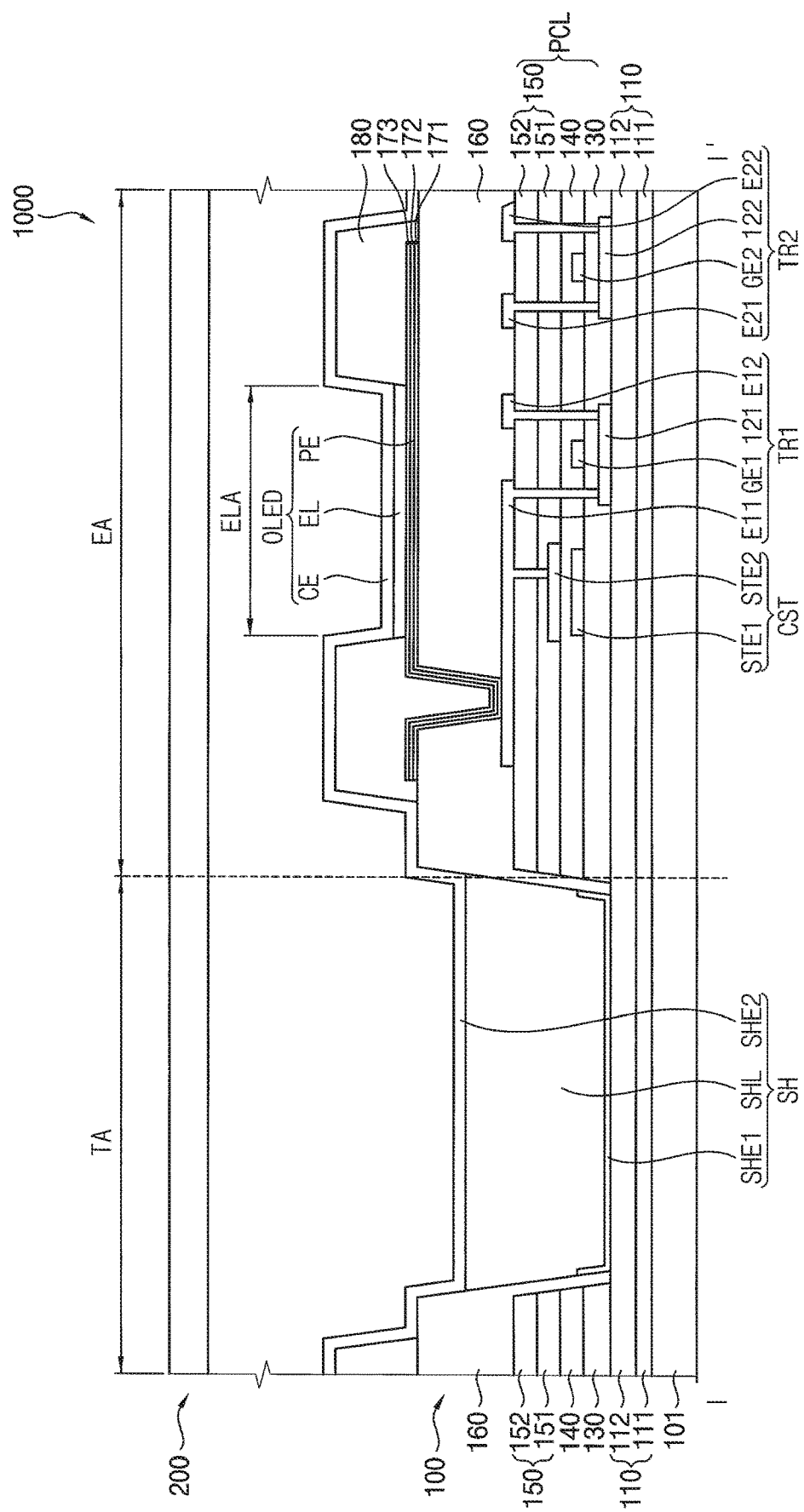
FIG. 4 is a cross-sectional view taken along the line I-I' of FIG. 1, according to an exemplary embodiment.

FIG. 4 is a cross-sectional view taken along the line I-I' of FIG. 1, according to an exemplary embodiment.

Referring to FIG. 4, the display apparatus 1000 may include a first substrate 100 and a second substrate 200.

The first substrate 100 may include a first base substrate 101, a buffer layer 110, a pixel circuit layer PCL, a planarization layer 160, a pixel electrode PE, a pixel defining layer 180, a light-emitting layer EL, a common electrode CE, and a shutter unit SH.

The first base substrate 101 may be formed of a transparent material. For example, the first base substrate 101 may include a quartz substrate, a synthetic quartz substrate, a calcium fluoride substrate, a fluoride-doping quartz substrate, a sodalime substrate, a non-alkali substrate, etc. Alternatively, the first base substrate 101 may be formed of a flexible transparent material such as a flexible transparent resin. For example, the flexible transparent resin substrate may include a first polyimide layer, a barrier film layer, a second polyimide layer, etc.

The buffer layer 110 may be disposed on the first base substrate 101. The buffer layer 110 may prevent diffusion of metal atoms and/or impurities into the first base substrate 101. Additionally, the buffer layer 110 may improve a surface flatness of the first base substrate 101. According to a type of the first base substrate 101, at least two buffer layers may be provided on the first base substrate 101. For example, the buffer layer 110 may include a first layer 111 formed of silicon nitride (SiNx) and a second layer 112 formed of silicon oxide (SiOx).

The first base substrate 101 on which the buffer layer 110 is disposed may include an emission area EA and a transmission area TA.

The pixel circuit layer PCL, the planarization layer 160, the pixel electrode PE, the pixel defining layer 180, the light-emitting layer EL, and the common electrode CE may be disposed in the emission area EA.

The pixel circuit layer PCL may include a first transistor TR1, a second transistor TR2, and a storage capacitor CST. The first transistor TR1 may include a first active pattern 121, a first gate electrode GE1, a first electrode E11, and a second electrode E12. The second transistor TR2 may include a second active pattern 122, a second gate electrode GE2, a first electrode E21 and a second electrode E22. The storage capacitor CST may include a first storage electrode STE1 and a second storage electrode STE2.

As shown in FIG. 4, the first and second active patterns 121 and 122 may be disposed on the buffer layer 110 in the emission area EA. For example, the first and second active patterns 121 and 122 may be formed of an oxide semiconductor, an inorganic semiconductor (e.g., amorphous silicon, polysilicon, etc.), an organic semiconductor, etc.

A gate insulating layer 130 may be disposed in the emission area EA on the buffer layer 110 on which the first and second active patterns 121 and 122 are disposed. The gate insulating layer 130 may be formed of silicon oxide (SiOx), silicon nitride (SiNx), silicon oxynitride (SiOxNy), silicon oxycarbide (SiOxCy), silicon carbon nitride (SiCxNy), aluminium oxide (AlOx), aluminium nitride (AlNx), tantalum oxide (TaOx), hafnium oxide (HfOx), zirconium oxide (ZrOx), titanium oxide (TiOx), etc.

The first storage electrode STE1, the first gate electrode GE1, and the second gate electrode GE2 may be formed using a first gate metal layer and are disposed on the gate insulating layer 130 in the emission area EA. The first gate metal layer may be formed of metal, alloy, metal nitride, conductive metal oxide, transparent conductive material, etc., which may be used alone or in any suitable combination.

A first insulating interlayer 140 may be disposed in the emission area EA of the first base substrate 101 on which the first storage electrode STE1, the first gate electrode GE1, and the second gate electrode GE2 are disposed. The first insulating interlayer 140 may be formed of silicon oxide, silicon nitride, silicon oxynitride, etc., which may be used alone or in any suitable combination.

A second storage electrode STE2 may be formed using a second gate metal layer and be disposed on the first insulating interlayer 140 in the emission area EA.

For example, the second gate metal layer may be formed of aurum (Au), argentum (Ag), aluminum (Al), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Jr), aluminium alloy, aluminium nitride (AlNx), argentum alloy, tungsten W, tungsten nitride (WNx), copper alloy, molybdenum alloy, titanium nitride (TiNx), tantalum nitride (TaNx), strontium ruthenium oxide (SrRuxOy), zinc oxide (ZnOx), indume tin oxide (ITO), stannum oxide (SnOx), indume oxide (InOx), gallium oxide (GaOx), indume zinc oxide (IZO), etc., which may be used alone or in any suitable combination.

A second insulating interlayer 150 may be disposed in the emission area EA on the first base substrate 101 on which the second storage electrode STE2 is disposed. The second insulating interlayer 150 may be formed of silicon oxide, silicon nitride, silicon oxynitride, etc., which may be used alone or in any suitable combination. For example, the second insulating interlayer 150 may include a first layer 151 formed of silicon oxide (SiOx) and a second layer 152 formed of silicon nitride (SiNx).

First and second electrodes E11 and E12 of the first transistor TR1 and first and second electrodes E21 and E22 of the second transistor TR2 may be formed using a source metal layer, and be disposed on the second insulating interlayer 150 in the emission area EA. The source metal layer may be formed of metal, alloy, metal nitride, conductive metal oxide, transparent conductive material, etc., which may be used alone or in any suitable combination.

The planarization layer 160 may be disposed in the emission area EA on the first base substrate 101 on which the first and second electrodes E11, E12, E21, and E22 are disposed. A via-hole VH that exposes the first electrode E11 of the first transistor TR1 may be formed in the planarization layer 160.

A pixel electrode PE of the organic light emitting diode OLED may be connected to the first transistor TR1 through the via-hole VH and may be disposed on the planarization layer 160 in the emission area EA.

The pixel electrode PE may be formed of metal, alloy, metal nitride, conductive metal oxide, transparent conductive material, etc., which may be used alone or in any suitable suitable combination. The transparent conductive material may include ITO, IZO and a-IZO. For example, the pixel electrode PE1 may have a multi-layer structure including a first transparent conductive layer 171, a metal layer 172, and a second transparent conductive layer 173.

The pixel defining layer 180 may be disposed in the emission area EA on the first base substrate 101 on which the pixel electrode PE is disposed. An opening that defines an OLED area ELA may be formed in the pixel defining layer 180 exposing a portion of the pixel electrode PE.

The light-emitting layer EL may be disposed in the OLED area ELA corresponding to the opening. The light-emitting layer EL may be formed using at least one of light emitting materials capable of generating different colors of light (e.g., a red color, a blue color, and a green color) according to the first to third subpixels.

Although not shown in figures, the light emitting layer EL may generate a white color by stacking a plurality of light emitting materials capable of generating different colors of light such as a red color, a green color, a blue color. When the light emitting layer EL may generate the white color, the second substrate 200 may include different color filters respectively corresponding to the first to third subpixels.

The common electrode CE may be disposed in the emission area EA on the first base substrate 101 on which the light-emitting layer EL is disposed. The common electrode CE may be formed of a transparent conductive material.

The transmission window TW may be defined by an opening portion formed in the transmission area TA exposing a portion of the buffer layer 110. The transmission window TW may be formed by etching one or more insulating layers formed in the transmission area TA on the first base substrate 101. The shutter unit SH may be disposed in the transmission window TW.

The shutter unit SH may include a first shutter electrode SHE1, a shutter layer SHL, and a second shutter electrode SHE2. The shutter unit SH may be driven in the transparent mode transmitting the light when the first and second shutter electrodes SHE1 and SHE2 receive same voltage, and the shutter unit SH may be driven in the opaque mode blocking the light when the first and second shutter electrodes SHE1 and SHE2 receive different voltages. Alternatively, the shutter unit SH may be driven in the transparent mode transmitting the light when the first and second shutter electrodes SHE1 and SHE2 receive different voltages, and, the shutter unit SH may be driven in the opaque mode blocking the light when the first and second shutter electrodes SHE1 and SHE2 receive same voltage. As shown in FIG. 4, the shutter unit SH may be disposed on the buffer layer 110 of the first base substrate 101 in the transmission area TA.

The first shutter electrode SHE1 may be disposed on the buffer layer 110 in the transmission area TA. The first shutter electrode SHE1 may be formed using a transparent conductive material. For example, the first shutter electrode SHE1 may be formed using the first transparent conductive layer 171 that is used to form the pixel electrode PE in the emission area EA.

The shutter layer SHL may be disposed on the first shutter electrode SHE1. The shutter layer SHL may include one of an electrochromic layer, a liquid crystal layer, and an electrophoresis layer.

The second shutter electrode SHE2 may be disposed in the transmission area TA on the first base substrate 101 on which the shutter layer SHL is disposed. The second shutter electrode SHE2 may extend from the common electrode CE disposed in the emission area EA and be formed from the same layer as the common electrode CE. According to the exemplary embodiment, the common electrode CE may be formed using the same transparent conductive layer that is used to form the second shutter electrode SHE2. The first shutter electrode SHE1 and the second shutter electrode SHE2 may be formed using the same transparent conductive material.

The second substrate 200 opposite to the first substrate 100 may be combined with the first substrate 100. The second substrate 200 may be formed of a transparent material. For example, the second substrate 200 may include a quartz substrate, a synthetic quartz substrate, a calcium fluoride substrate, a fluoride-doping quartz substrate, a sodalime substrate, a non-alkali substrate, etc. Alternatively, the second substrate 200 may be formed of a flexible transparent material such as a flexible transparent resin. For example, the flexible transparent resin substrate may include a first polyimide layer, a barrier film layer, a second polyimide layer, etc.

According to the exemplary embodiment, the display apparatus may be driven in the transparent mode in an indoor environment in which an intensity of the external light is lower than that of the external light in an outdoor environment, and the transmission area TA may transmit the external light. Therefore, the display apparatus may increase the luminance of the light emitted from the emission area EA. However, the display apparatus may be driven in the opaque mode in the outdoor environment in which the intensity of the external light is higher than that of the external light in the indoor environment, and the transmission area TA may block the external light. Therefore, the display apparatus may prevent the light emitted from the emission area EA from being mixed with the external light, thus the visibility may increase.

FIGS. 5 to 10 are cross-sectional views illustrating a method of manufacturing a first substrate according to an exemplary embodiment.

Figure 5:
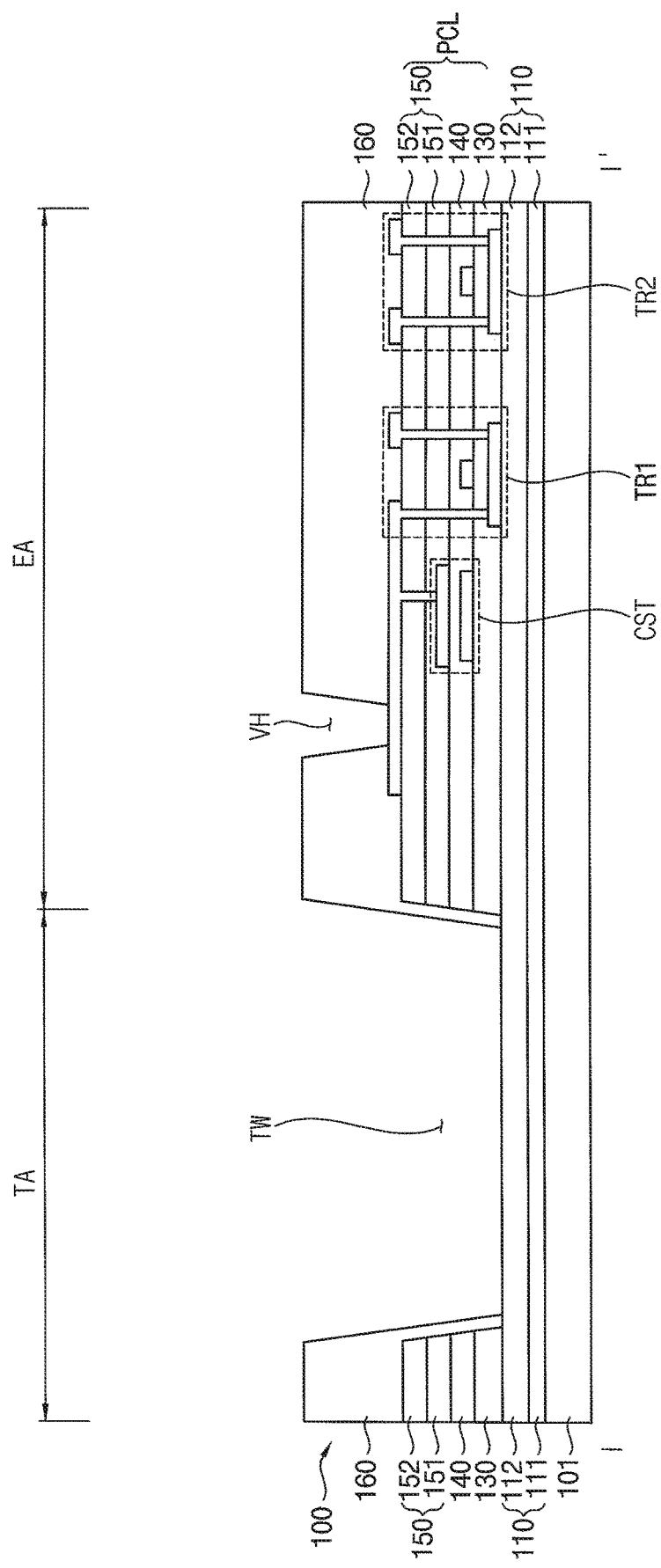
FIGS. 5 to 10 are cross-sectional views illustrating a method of manufacturing a first substrate according to an exemplary embodiment.

Referring to FIGS. 4 and 5, the first base substrate 101 may include a quartz substrate, a synthetic quartz substrate, a calcium fluoride substrate, a fluoride-doping quartz substrate, a sodalime substrate, a non-alkali substrate, etc.

A buffer layer 110 may be formed on the first base substrate 101. The buffer layer 110 may prevent diffusion of metal atoms and/or impurities into the first base substrate 101. The buffer layer 110 may have a multi-layer structure. For example, the buffer layer 110 may include a first layer 111 formed of silicon nitride (SiNx), and a second layer 112 formed of silicon oxide (SiOx).

An active layer may be formed on the buffer layer 110. The active layer may be formed of an oxide semiconductor, an inorganic semiconductor (e.g., amorphous silicon, polysilicon, etc.), an organic semiconductor, etc. The active layer may be patterned to form a first active pattern 121 of the first transistor TR1 and a second active pattern 122 of the second transistor TR2.

A gate insulating layer 130 may be disposed on the first base substrate 101 on which the first and second active patterns 121 and 122 are formed. The gate insulating layer 130 may be formed of silicon oxide (SiOx), silicon nitride (SiNx), silicon oxynitride (SiOxNy), silicon oxycarbide (SiOxCy), silicon carbon nitride (SiCxNy), aluminium oxide (AlOx), aluminium nitride (AlNx), tantalum oxide (TaOx), hafnium oxide (HfOx), zirconium oxide (ZrOx), titanium oxide (TiOx), etc.

A first gate metal layer may be disposed on the gate insulating layer 130. The first gate metal layer may be formed of metal, alloy, metal nitride, conductive metal oxide, transparent conductive material, etc. The first gate metal layer may be patterned to form a first gate metal pattern. The first gate metal pattern may include a first storage electrode STE1, a first gate electrode GE1, and a second gate electrode GE2.

A first insulating interlayer 140 may be disposed on first base substrate 101 on which the first storage electrode STE1, the first gate electrode GE1, and the second gate electrode GE2 are formed. The first insulating interlayer 140 may be formed of silicon oxide, silicon nitride, silicon oxynitride, etc., which may be used alone or in any suitable combination.

A second gate metal layer may be disposed on the first insulating interlayer 140. The second gate metal layer may be patterned to form a second gate metal pattern. The second gate metal pattern may include a second storage electrode STE2.

A second insulating interlayer 150 may be disposed on the first base substrate 101 on which the second storage electrode STE2 is formed. The second insulating interlayer 150 may include a first layer 151 formed of silicon oxide (SiOx) and a second layer 152 formed of silicon nitride (SiNx).

A plurality of contact holes may be formed on the first base substrate 101 in the emission area EA, and a transmission window TW that exposes the buffer layer 110 may be formed on the first base substrate 101 in the transmission area TA.

A source metal layer may be disposed on the second insulating interlayer 150. The source metal layer may be patterned to form a source metal pattern. The source metal pattern may include first and second electrodes E11 and E12 of the first transistor TR1 and first and second electrodes E21 and E22 of the second transistor TR2. The source metal pattern, the first gate metal pattern, and the second gate metal pattern may be connected to each other through the plurality of contact holes.

A planarization layer 160 may be disposed on the first base substrate 101 on which the first and second electrodes E11, E12, E21 and E22 are disposed. The planarization layer 160 may be formed of an organic material or an inorganic material. The planarization layer 160 may be patterned to form a via-hole VH that exposes the first electrode E11 of the first transistor TR1 in the emission area EA and the transmission window TW that exposes the buffer layer 110 in the transmission area TA.

Figure 6:
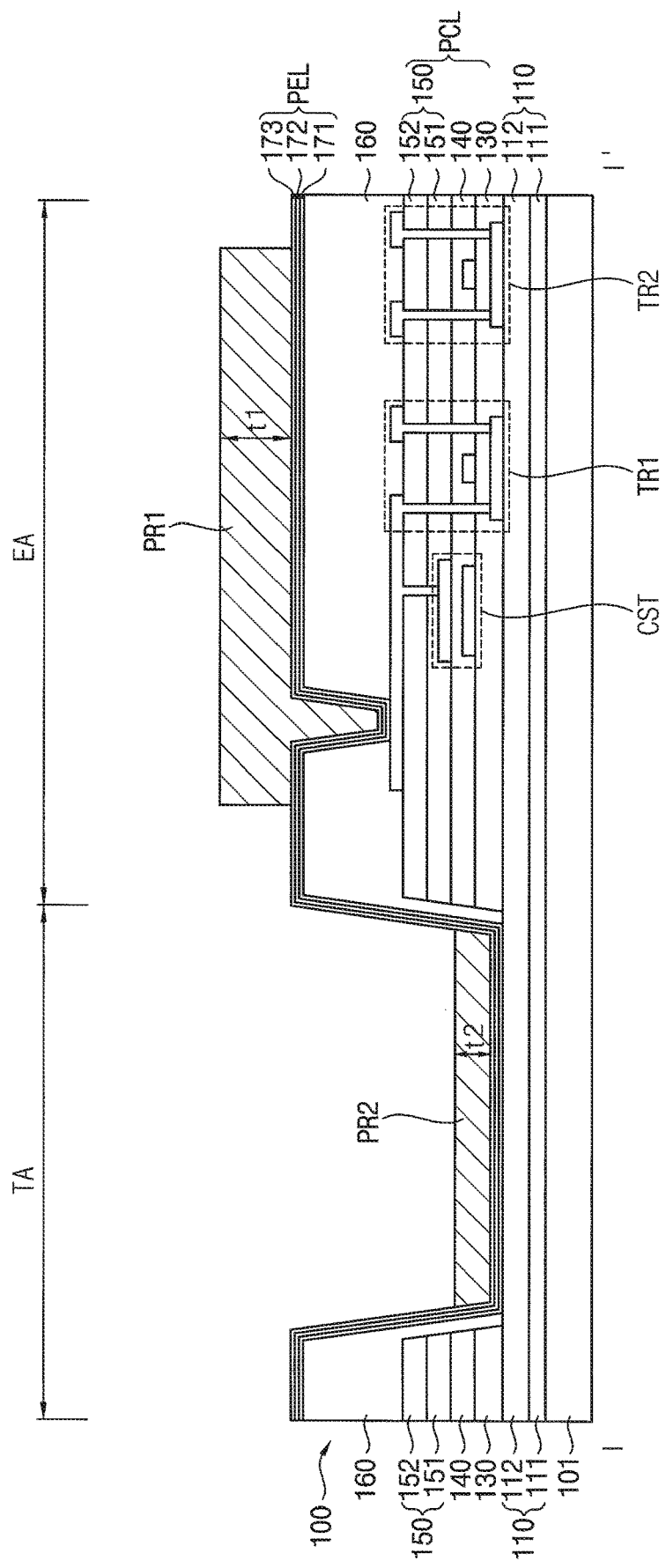

Referring to FIGS. 4 and 6, a pixel electrode layer PEL may be disposed on the first base substrate 101 on which the via-hole VH and the transmission window TW are formed. The pixel electrode layer PEL may be formed of metal, alloy, metal nitride, conductive metal oxide, transparent conductive material, etc., which may be used alone or in any suitable suitable combination. For example, the pixel electrode layer PEL may have a multi-layer structure including a first transparent conductive layer 171, a metal layer 172, and a second transparent conductive layer 173 that are sequentially stacked.

A photoresist layer may be disposed on the first base substrate 101 on which the pixel electrode layer PEL is disposed. The photoresist layer may be patterned by using a halftone-mask through a photolithography process. Thus, a first photoresist pattern PR1 having a first thickness t1 may be formed in the emission area EA. A second photoresist pattern PR2 having a second thickness t2 thinner than the first thickness t1 may be formed in the transmission area TA. The first photoresist pattern PR1 may be disposed in an area in which the pixel electrode PE is formed, and the second photoresist pattern PR2 may be disposed in an area in which the first shutter electrode SHE1 is formed.

Figure 7:
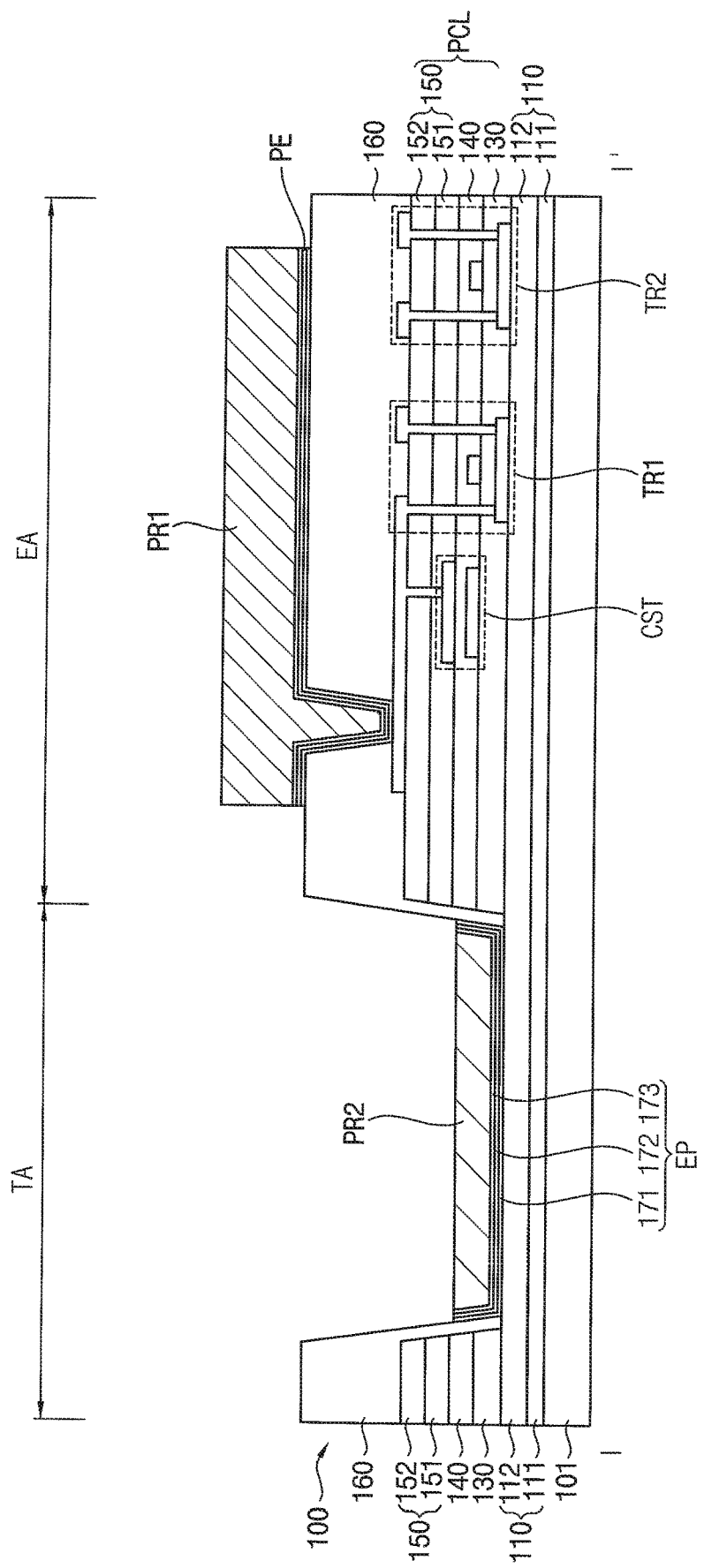

Referring to FIGS. 4 and 7, the pixel electrode layer PEL may be patterned using the first and second photoresist patterns PR1 and PR2. The pixel electrode PE may be formed in the emission area EA, and an electrode pattern EP corresponding to the first shutter electrode SHE1 of the shutter unit SH may be formed in the transmission area TA.

Figure 8:
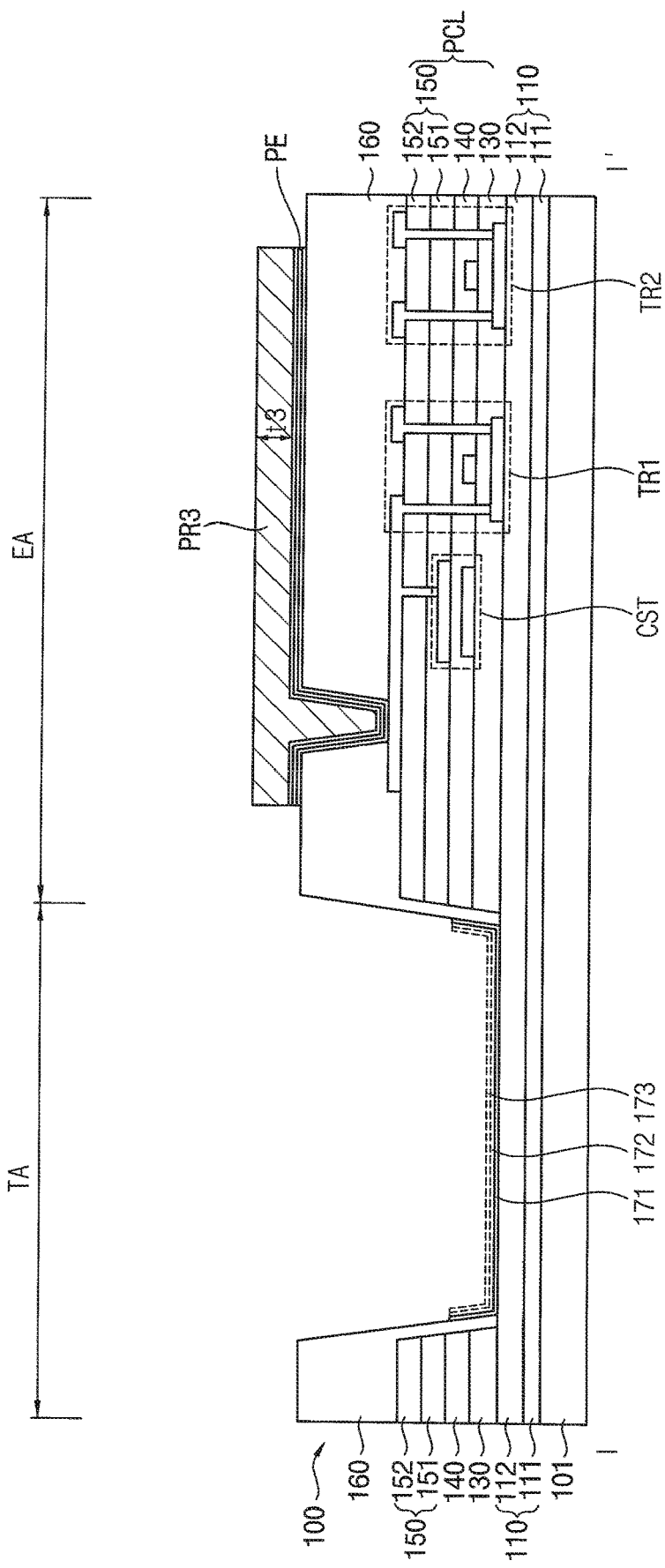

Referring to FIGS. 4 and 8, the first and second photoresist patterns PR1 and PR2 may be removed by a predetermined thickness through an ashing process using oxygen plasma. The predetermined thickness may be larger than the second thickness t2 and less than the first thickness t1.

After the ashing process, a third photoresist pattern PR3 having a third thickness t3 may be remained in the emission area EA and the second photoresist pattern PR2 may be entirely removed in the transmission area TA.

The second transmission layer 173 of the electrode pattern EP and the metal layer 172 may be sequentially removed using the third photoresist pattern PR3. The first transparent electrode layer 171 may remain to form the first shutter electrode SHE1 of the shutter unit SH. Then, the third photoresist pattern PR3 may be removed in the emission area EA through the ashing process using oxygen plasma.

Figure 9:
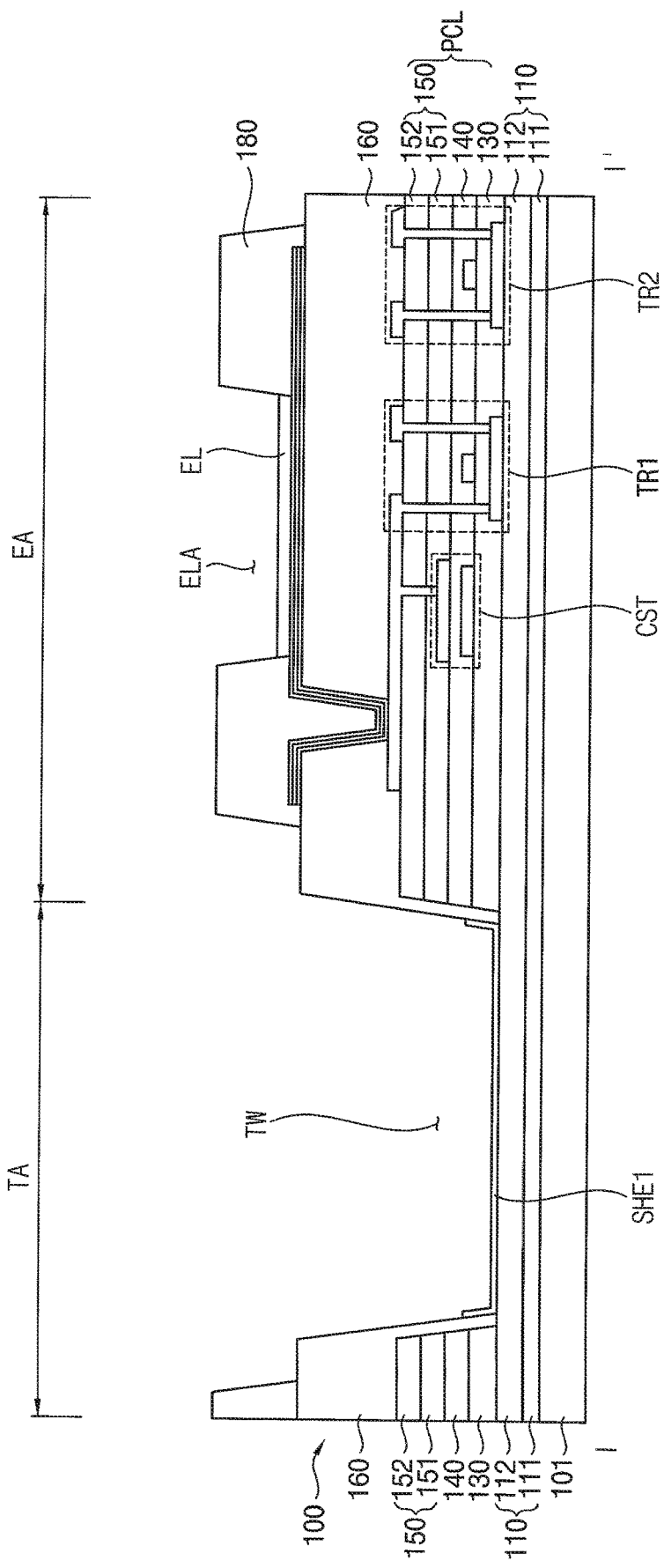

Referring to FIGS. 4 and 9, the pixel electrode PE including the first transparent conductive layer 171, the metal layer 172, and the second transparent conductive layer 173 may be formed in the emission area EA. The first shutter electrode SHE1 of the shutter unit SH may be formed in the transmission window TW corresponding to the transmission area TA using the first transparent electrode layer 171 of the pixel electrode layer PEL.

A pixel defining layer 180 may be formed on the first base substrate 101 on which the pixel electrode PE and the first shutter electrode SHE1 are disposed. The pixel defining layer 180 is patterned to form an opening that exposes the pixel electrode PE and defines an OLED area ELA.

A light-emitting layer EL may be formed on the pixel electrode PE in the OLED area ELA. The pixel electrode PE may be used as an anode electrode of the OLED. The light-emitting layer EL may be formed using at least one of light emitting materials capable of generating different colors of light (e.g., a red color, a blue color, and a green color) according to the first to third subpixels.

Figure 10:
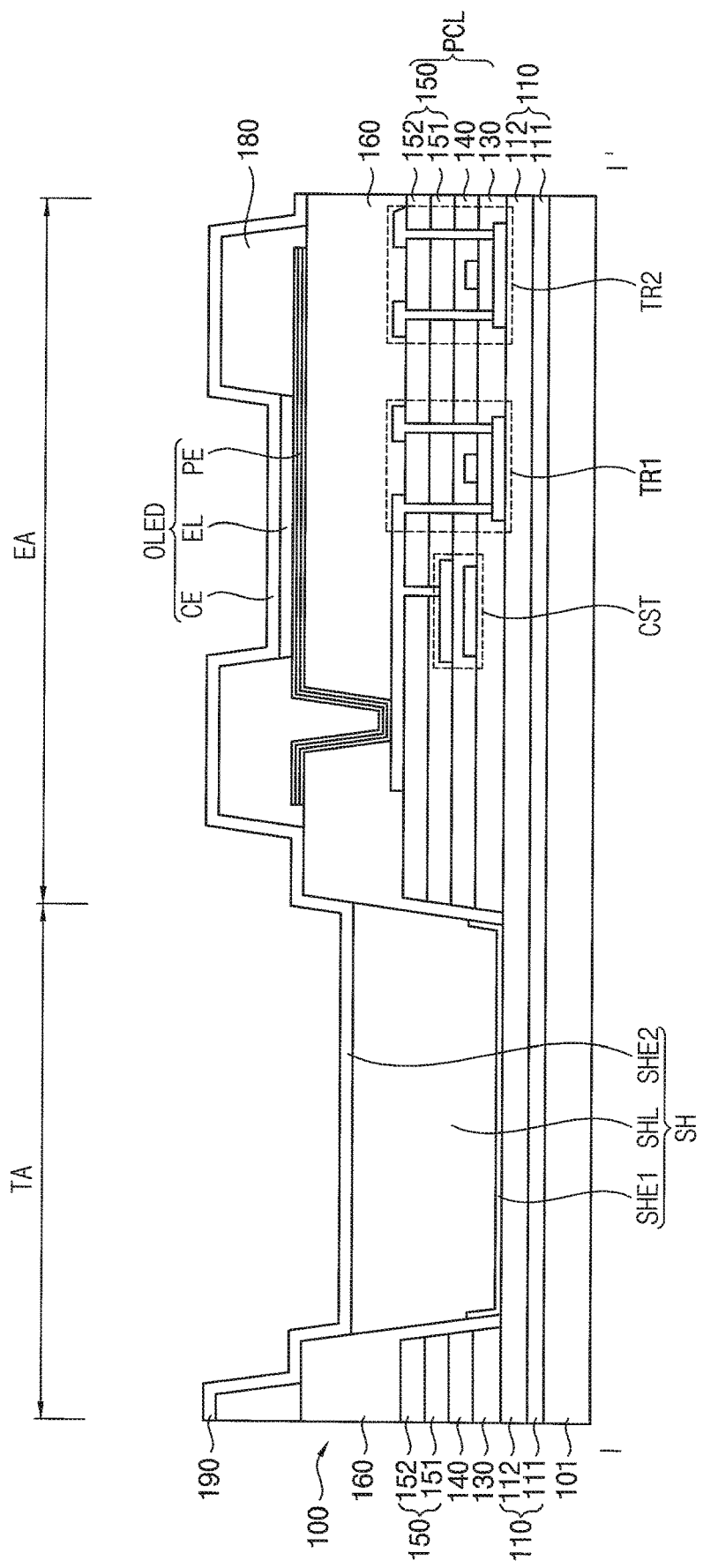

Referring to FIGS. 4 and 10, a shutter layer SHL may be formed on the first shutter electrode SHE1 in the transmission area TA. The shutter layer SHL may include a material (e.g., an electrochromic material, liquid crystal, and an electrophoresis material) that can transmit and block the light according to a potential difference.

The shutter layer SHL may be formed in the transmission area TA and, a transparent conductive layer 190 may be disposed on the first base substrate 101 in the emission area EA in which the light-emitting layer EL is formed and the transmission area TA in which the shutter layer SHL is formed.

Therefore, the transparent conductive layer 190 may be used as a cathode electrode (herein also referred to as the common electrode CE) of the organic light emitting diode OLED in the emission area EA and as a second shutter electrode SHE2 of the shutter unit SH in the transmission area EA.

According to the exemplary embodiment, the first substrate may include the shutter unit SH that controls transmissivity of the transmitted light in the transmission area TA. The second shutter electrode SHE2 may be formed using the transparent conductive layer that is used to form the common electrode CE of the organic light emitting diode OLED, and the second shutter electrode SHE2 of the shutter unit SH and the common electrode CE of the organic light emitting diode OLED may be connected to each other. According to one embodiment, the shutter unit SH in the transmission area TA may be driven in the transparent mode or the opaque mode according to a driving voltage applied to the first shutter electrode SHE1.

Figure 11:
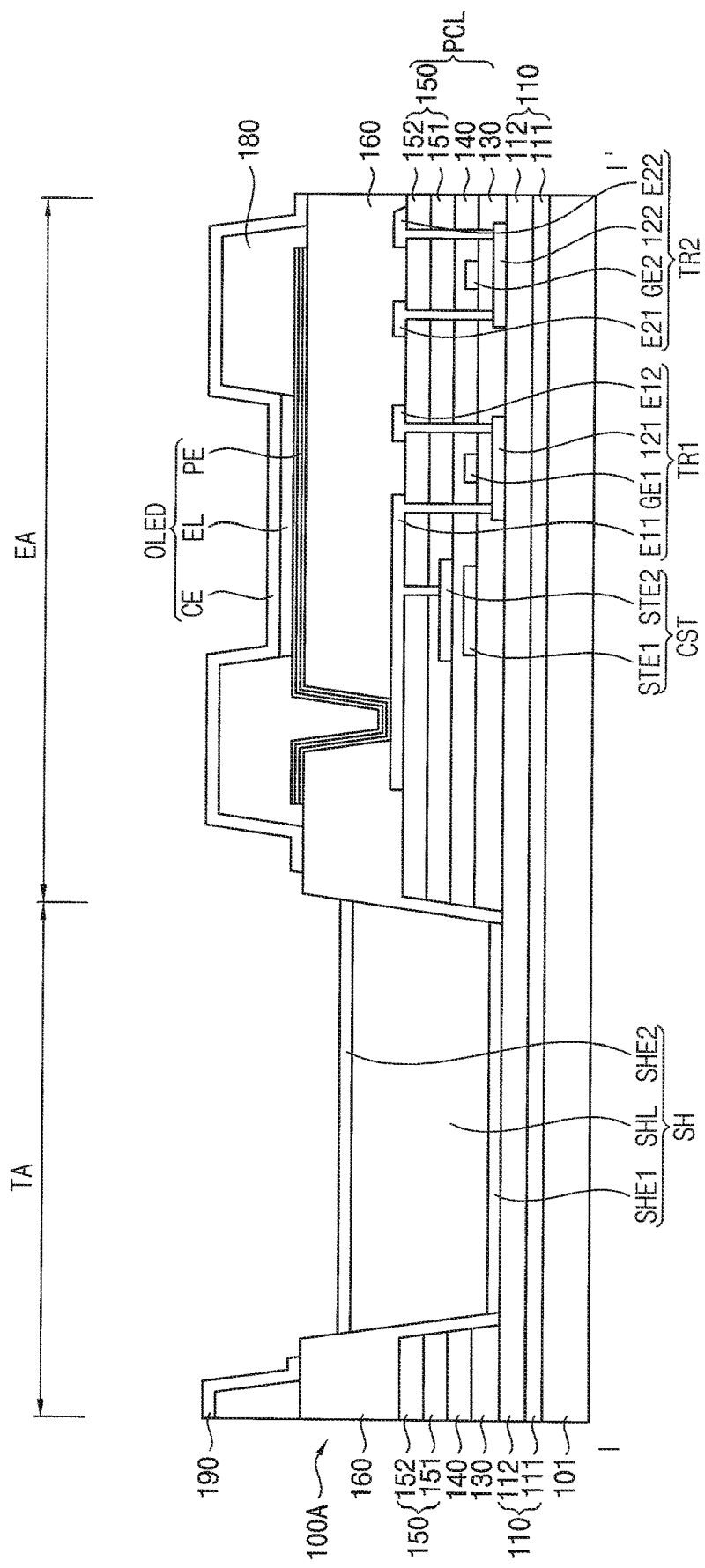
FIG. 11 is a cross-sectional view illustrating a first substrate according to an exemplary embodiment.

FIG. 11 is a cross-sectional view illustrating a first substrate according to an exemplary embodiment.

Referring to FIGS. 1 and 11, the first substrate 100A in comparison with the first substrate 100 includes a second shutter electrode SHE2 of the shutter unit SH that is separated from a common electrode CE of the organic light emitting diode OLED.

According to the exemplary embodiment, the shutter unit SH in the transmission area TA may be driven in the transparent mode or the opaque mode according to driving voltages applied to the first and second shutter electrodes SHE1 and SHE2. For example, when same driving voltages are applied to the first and second shutter electrodes SHE1 and SHE2, the shutter unit SH may transmit the light, and the transmission area TA may be driven in the transparent mode. However, when different driving voltages are applied to the first and second shutter electrodes SHE1 and SHE2, the shutter unit SH may block the light, and the transmission area TA may be driven in the opaque mode.

A method of manufacturing the first substrate 100A in comparison with the method of manufacturing the first substrate 100 according to the previous exemplary embodiment may include substantially similar processes as those described referring to FIGS. 5 to 10. Hereinafter, the same reference numerals will be used to refer to the same or like parts as those described in the previous exemplary embodiment, and any repetitive detailed explanation may be omitted.

Referring to FIGS. 10 and 11, the transparent conductive layer 190 may be formed on the first base substrate 101 on which the shutter layer SHL is formed in the transmission area TA, and the light-emitting layer EL is formed in the emission area EA.

The transparent conductive layer 190 may be patterned to form a common electrode CE (e.g., a cathode electrode) of the organic light emitting diode OLED in the emission area EA and a second shutter electrode SHE2 of the shutter unit SH in the transmission area EA. The common electrode CE of the organic light emitting diode OLED may be electrically disconnected and spaced apart from the second shutter electrode SHE2 of the shutter unit SH.

According to the exemplary embodiment, the first substrate 100A may include the shutter unit SH that controls light transmitted through the transmission area TA. The shutter unit SH may be driven independently from the organic light emitting diode OLED. The transmission area TA of the first substrate 100A may be driven in the transparent mode and the opaque mode.

Figure 12:
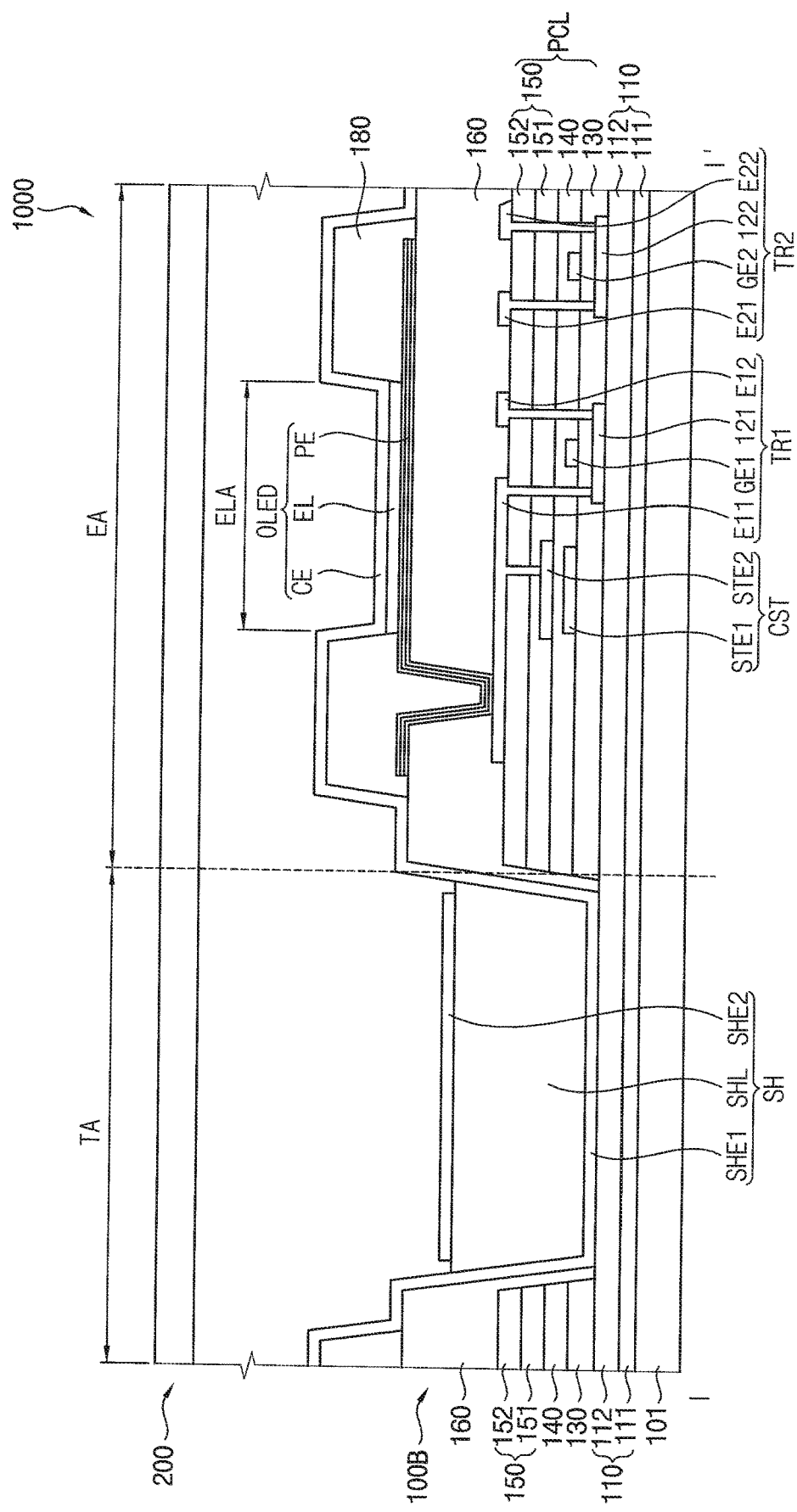
FIG. 12 is a cross-sectional view illustrating a display apparatus according to an exemplary embodiment.

FIG. 12 is a cross-sectional view illustrating a display apparatus according to an exemplary embodiment.

Referring to FIGS. 1 and 12, the display apparatus may include a first substrate 100B and a second substrate 200. Hereinafter, the same reference numerals will be used to refer to the same or like parts as those described in the previous exemplary embodiment, and any repetitive detailed explanation may be omitted.

The first substrate 100B may include a first base substrate 101, a buffer layer 110, a pixel circuit layer PCL, a planarization layer 160, a pixel electrode PE, a pixel defining layer 180, a light-emitting layer EL, a common electrode CE, and a shutter unit SH.

The first base substrate 101 may be formed of a transparent material. For example, the first base substrate 101 may include a quartz substrate, a synthetic quartz substrate, a calcium fluoride substrate, a fluoride-doping quartz substrate, a sodalime substrate, a non-alkali substrate, etc. Alternatively, the first base substrate 101 may be formed of a flexible transparent material such as a flexible transparent resin.

The buffer layer 110 may be disposed on the first base substrate 101. For example, the buffer layer 110 may include a first layer 111 formed of silicon nitride (SiNx) and a second layer 112 formed of silicon oxide (SiOx).

The first base substrate 101 on which the buffer layer 110 is disposed may include an emission area EA and a transmission area TA.

The pixel circuit layer PCL, the planarization layer 160, the pixel electrode PE, the pixel defining layer 180, the light-emitting layer EL, and the common electrode CE may be disposed in the emission area EA.

The pixel circuit layer PCL may include a first transistor TR1, a second transistor TR2, and a storage capacitor CST. The first transistor TR1 may include a first active pattern 121, a first gate electrode GE1, a first electrode E11, and a second electrode E12. The second transistor TR2 may include a second active pattern 122, a second gate electrode GE2, a first electrode E21, and a second electrode E22. The storage capacitor CST may include a first storage electrode STE1 and a second storage electrode STE2.

The first and second active patterns 121 and 122 may be formed on the buffer layer 110 in the emission area EA.

A gate insulating layer 130 may be disposed on the buffer layer 110 in the emission area EA on which the first and second active patterns 121 and 122 are formed.

The first storage electrode STE1, the first gate electrode GE1, and the second gate electrode GE2 may be formed using a first gate metal layer and are disposed on the gate insulating layer 130 in the emission area EA.

A first insulating interlayer 140 may be disposed in the emission area EA of the first base substrate 101 on which the first storage electrode STE1, the first gate electrode GE1, and the second gate electrode GE2 are disposed. The first insulating interlayer 140 may be formed of silicon oxide, silicon nitride, silicon oxynitride, etc., which may be used alone or in any suitable combination.

The second storage electrode STE2 may be formed using a second gate metal layer and may be disposed on the first insulating interlayer 140 in the emission area EA.

A second insulating interlayer 150 may be disposed in the emission area EA on the first base substrate 101 on which the second storage electrode STE2 is disposed. For example, the second insulating interlayer 150 may include a first layer 151 formed of silicon oxide (SiOx) and a second layer 152 formed of silicon nitride (SiNx).

The first and second electrodes E11 and E12 of the first transistor TR1 and the first and second electrodes E21 and E22 of the second transistor TR2 may be formed using a source metal layer, and be disposed on the second insulating interlayer 150 in the emission area EA.

The planarization layer 160 may be disposed in the emission area EA on the first base substrate 101 on which the first and second electrodes E11, E12, E21, and E22 are disposed. A via-hole VH that exposes the first electrode E11 of the first transistor TR1 may be formed in the planarization layer 160.

A pixel electrode PE of the organic light emitting diode OLED may be connected to the first transistor TR1 through the via-hole VH and may be disposed on the planarization layer 160 in the emission area EA.

The pixel electrode PE may be formed of metal, alloy, metal nitride, conductive metal oxide, transparent conductive material, etc., which may be used alone or in any suitable combination.

The pixel defining layer 180 may be disposed in the emission area EA on the first base substrate 101 on which the pixel electrode PE is disposed. An opening that defines an OLED area ELA may be formed in the pixel defining layer 180, and the opening may expose a portion of the pixel electrode PE.

The light-emitting layer EL may be disposed in the OLED area ELA corresponding to the opening.

The common electrode CE may be disposed in the emission area EA on the first base substrate 101 on which the light-emitting layer EL is disposed. The common electrode CE may be formed of a transparent conductive material.

According to the exemplary embodiment, the common electrode CE may be connected to a first shutter electrode SHE1 of the shutter unit SH and may be formed using the same transparent conductive layer as the first shutter electrode SHE1.

The transmission window TW may be defined by an opening portion formed in the transmission area TA exposing a portion of the buffer layer 110. The transmission window TW may be formed by etching one or more insulating layers disposed on the first base substrate 101 in the transmission area TA. The shutter unit SH may be formed in the transmission window TW.

As shown in FIG. 12, the shutter unit SH may be disposed on the buffer layer 110 in the transmission area TA of the first base substrate 101.

The first shutter electrode SHE1 may be disposed on the buffer layer 110 in the transmission area TA.

According to the exemplary embodiment, the first shutter electrode SHE1 may extend from the common electrode CE that is disposed in the emission area EA and may be connected to the common electrode CE.

The shutter layer SHL may be disposed on the first shutter electrode SHE1. The shutter layer SHL may include one of an electrochromic layer, a liquid crystal layer, and an electrophoresis layer.

The second shutter electrode SHE2 may be disposed in the transmission area TA on the first base substrate 101 on which the shutter layer SHL is disposed.

The second substrate 200 opposite to the first substrate 100 may be combined with the first substrate 100. The second substrate 200 may be formed of a transparent material.

Figure 13:
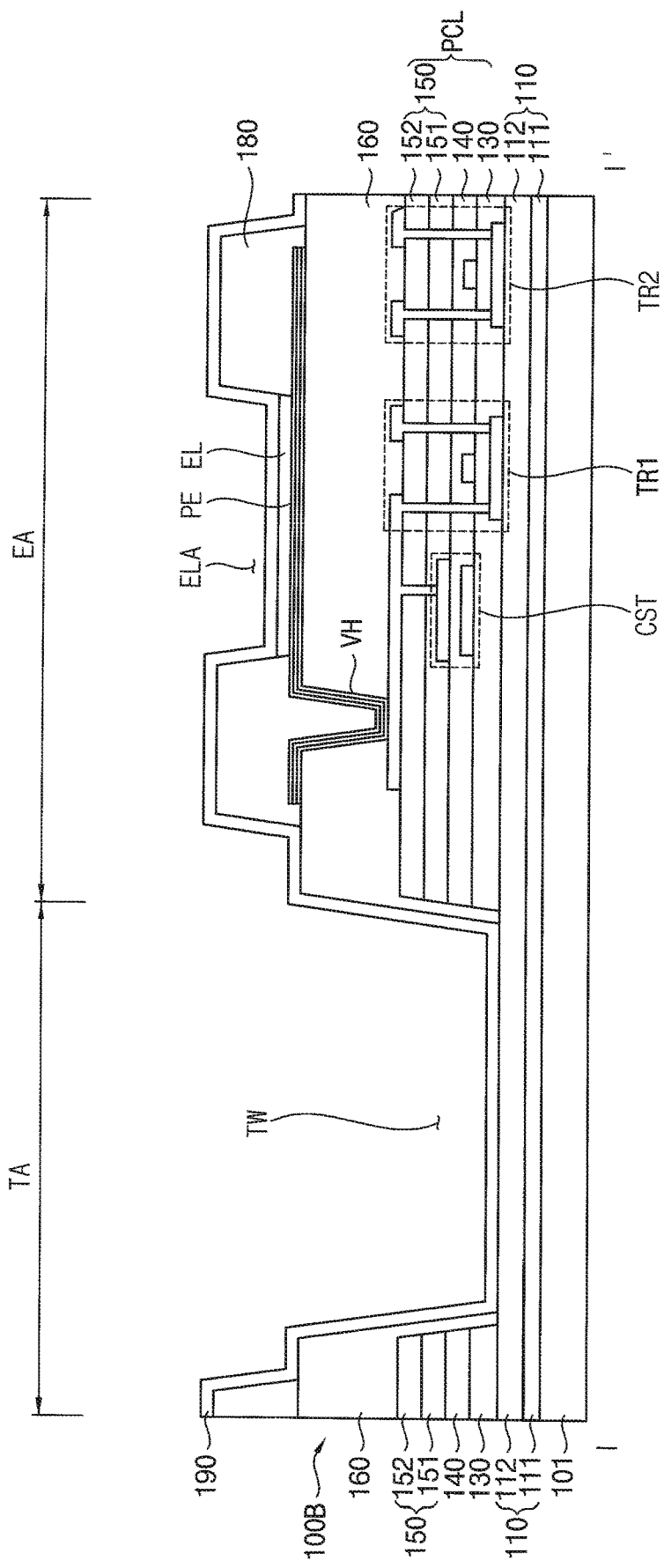
FIGS. 13 to 15 are cross-sectional views illustrating a method of manufacturing a first substrate shown in FIG. 12.
Figure 14:
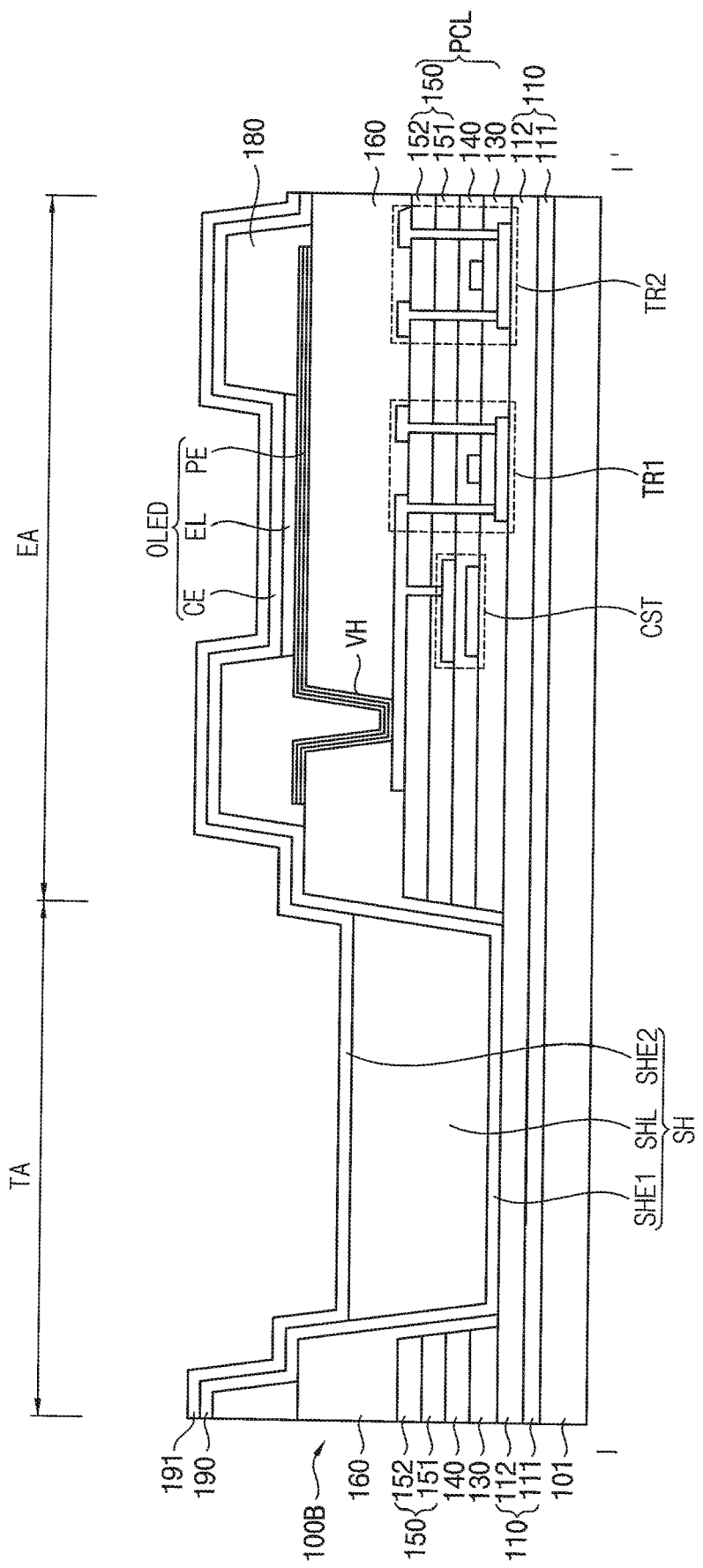
Figure 15:
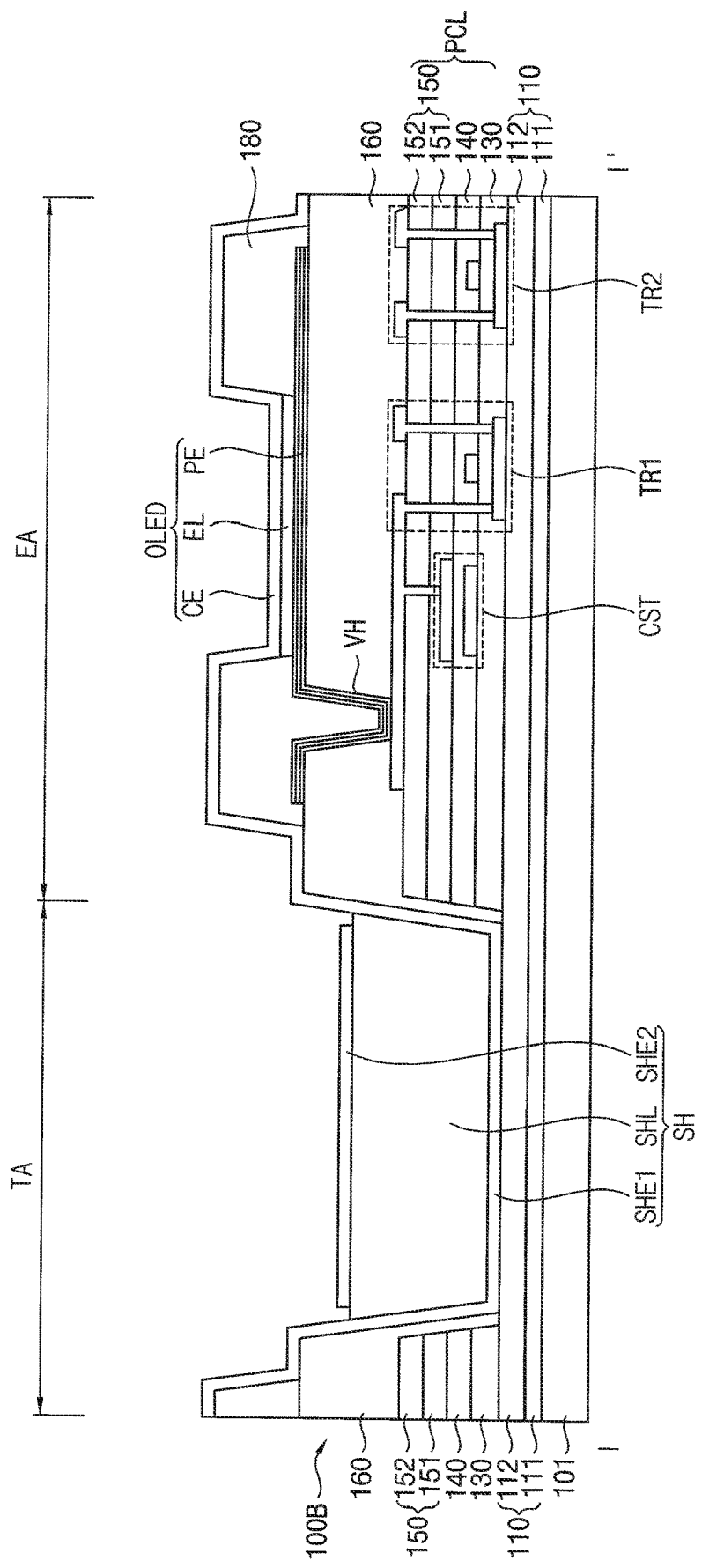

FIGS. 13 to 15 are cross-sectional views illustrating a method of manufacturing a first substrate shown in FIG. 12.

The method of manufacturing the first substrate 100B in comparison with the method of manufacturing the first substrate 100 according to the previous exemplary embodiment may include substantially similar processes as those described referring to FIG. 5. Hereinafter, the same reference numerals will be used to refer to the same or like parts as those described in the previous exemplary embodiment, and any repetitive detailed explanation may be omitted.

Referring to FIGS. 12 and 13, the planarization layer 160 may be patterned to form a via-hole VH that exposes the first electrode E11 of the first transistor TR1 in the emission area EA and the transmission window TW that exposes a portion of the buffer layer 110 in the transmission area TA. Then, a pixel electrode layer PEL may be disposed on the first base substrate 101 on which the planarization layer 160 is patterned. The pixel electrode layer PEL may be formed of metal, alloy, metal nitride, conductive metal oxide, transparent conductive material, etc., which may be used alone or in any suitable combination. For example, the pixel electrode layer PEL may have a multi-layer structure including a first transparent conductive layer, a metal layer, and a second transparent conductive layer that are sequentially stacked.

The pixel electrode layer PEL may be patterned to form the pixel electrode PE in the emission area EA.

A pixel defining layer 180 may be disposed on the first base substrate 101 on which the pixel electrode PE is formed. The pixel defining layer 180 is patterned to form an opening that exposes a portion of the pixel electrode PE and defines an OLED area ELA.

A light-emitting layer EL may be formed on the pixel electrode PE in the OLED area ELA. The light-emitting layer EL may be formed using at least one of light emitting materials capable of generating different colors of light (e.g., a red color, a blue color t, and a green color) according to the first to third subpixels.

Therefore, the transmission window TW that exposes the buffer layer 110 and transmits light may be formed in the transmission area TA of the first base substrate 101, and the light-emitting layer EL may be formed on the pixel electrode PE in the OLED area ELA of the first base substrate 101.

The first transparent conductive layer 190 may be disposed in the emission area EA and the transmission area TA.

The first transparent conductive layer 190 may be used as a common electrode CE (e.g., a cathode electrode) of the organic light emitting diode OLED in the emission area EA and the first shutter electrode SHE1 of the shutter unit SH in the transmission area EA.

Referring to FIGS. 12 and 14, the shutter layer SHL may be disposed on the first shutter electrode SHE1 in the transmission area TA. The shutter layer SHL may include a material (e.g., an electrochromic material, liquid crystal, and an electrophoresis material) that can transmit and block the light according to a potential difference.

The second transparent conductive layer 191 may be disposed on the first base substrate 101 on which the shutter layer SHL is formed.

Referring to FIGS. 12 and 15, the second transparent conductive layer 191 may be patterned to form the second shutter electrode SHE2 of the shutter layer SHL. The second transparent conductive layer 191 may be selectively etched differently from that of the first transparent conductive layer 190.

According to the exemplary embodiment, the first substrate 100B may include the shutter unit SH that controls transmissivity of the transmitted light in the transmission area TA. The first shutter electrode SHE1 of the shutter unit SH may be formed from the transparent conductive layer that is used to form the common electrode CE of the organic light emitting diode OLED, and the first shutter electrode SHE1 of the shutter unit SH and the common electrode CE of the organic light emitting diode OLED may be connected to each other. According to one embodiment, the shutter unit SH in the transmission area TA may be driven in the transparent mode or the opaque mode according to a driving voltage applied to the second shutter electrode SHE2.

Figure 16:
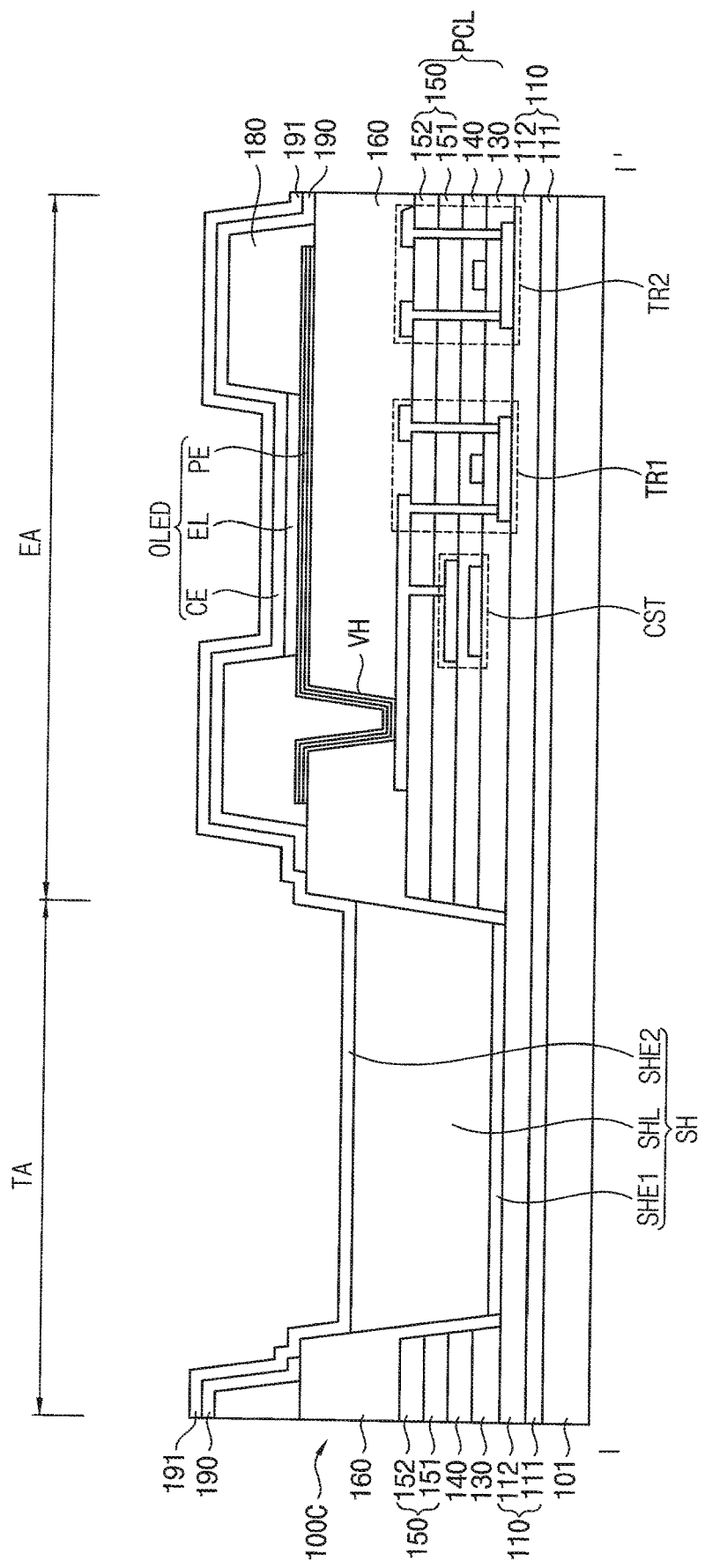
FIG. 16 is a cross-sectional view illustrating a first substrate according to an exemplary embodiment.

FIG. 16 is a cross-sectional view illustrating a first substrate according to an exemplary embodiment.

The method of manufacturing the first substrate 100C in comparison with the method of manufacturing the first substrate 100B according to the previous exemplary embodiment may include substantially similar processes as those described referring to FIG. 14. Hereinafter, the same reference numerals will be used to refer to the same or like parts as those described in the previous exemplary embodiment, and any repetitive detailed explanation may be omitted.

Referring to FIG. 16 in comparison with the first substrate 100B shown in FIG. 13, the first substrate 100C may include a first transparent conductive layer 190 and a second transparent conductive layer 191. The first transparent conductive layer 190 may be disposed in the emission area EA and the transmission area TA.

The first transparent conductive layer 190 may be patterned to form a common electrode CE of the organic light emitting diode OLED overlapping with the light-emitting layer EL in the emission area EA, and the first shutter electrode SHE1 of the shutter unit SH in the transmission area TA.

The shutter layer SHL may be disposed on the first shutter electrode SHE1 in the transmission area TA. The shutter layer SHL may include a material (e.g., an electrochromic material, liquid crystal, and an electrophoresis material) that can transmit and block the light according to a potential difference.

The second transparent conductive layer 191 may be disposed overlapping the common electrode CE in the emission area EA and the shutter layer SH in the transmission area TA.

The second transparent conductive layer 191 may be connected to the common electrode CE of the organic light emitting diode OLED and may directly contact the shutter layer SHL of the shutter unit SH.

According to the exemplary embodiment, the second shutter electrode SHE2 of the shutter unit SH may be formed using the second transparent conductive layer 191 and may directly contact the common electrode CE of the organic light emitting diode OLED. According to one embodiment, the shutter unit SH in the transmission area TA may be driven in the transparent mode or the opaque mode according to a driving voltage applied to the first shutter electrode SHE1.

Figure 17:
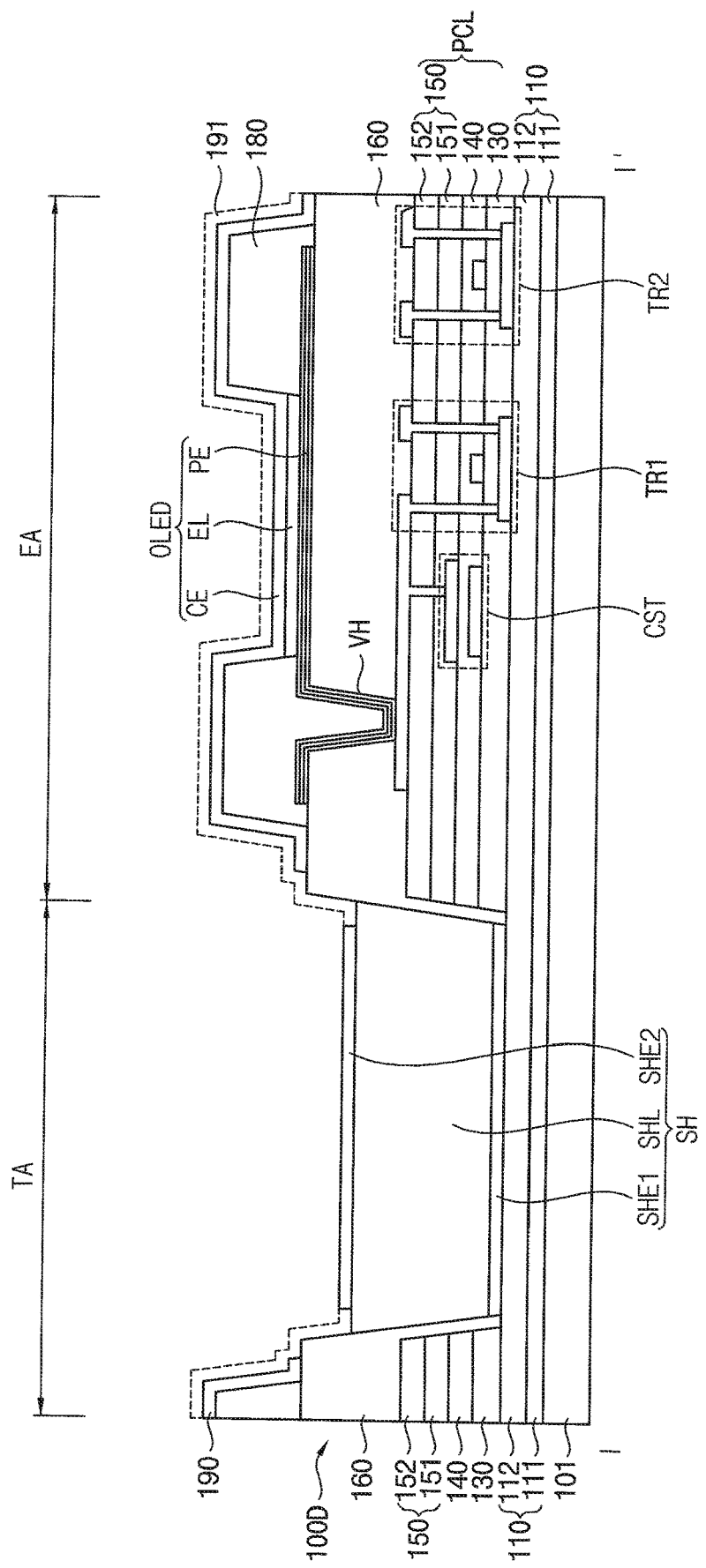
FIG. 17 is a cross-sectional view illustrating a first substrate according to an exemplary embodiment.

FIG. 17 is a cross-sectional view illustrating a first substrate according to an exemplary embodiment.

The method of manufacturing the first substrate 100D in comparison with the method of manufacturing the first substrate 100C according to the previous exemplary embodiment may include substantially similar processes as those described referring to FIG. 16. Hereinafter, the same reference numerals will be used to refer to the same or like parts as those described in the previous exemplary embodiment, and any repetitive detailed explanation may be omitted.

Referring to FIG. 17 in comparison with the first substrate 100C shown in FIG. 16, the first substrate 100D may include a second transparent conductive layer 191. The second transparent conductive layer 191 may be disposed in the emission area EA and the transmission area TA on the first base substrate 101.

The second transparent conductive layer 191 may be patterned to fully expose the common electrode CE in form the emission area EA and to form the second shutter electrode SHE2 of the shutter unit SH in the transmission area TA. The second transparent conductive layer 191 may by selectively etched differently from that of the first transparent conductive layer 190.

According to the exemplary embodiment, the shutter unit SH may be driven independently from the organic light emitting diode OLED. The transmission area TA of the first substrate 100D may be driven in the transparent mode and the opaque mode.

Figure 18:
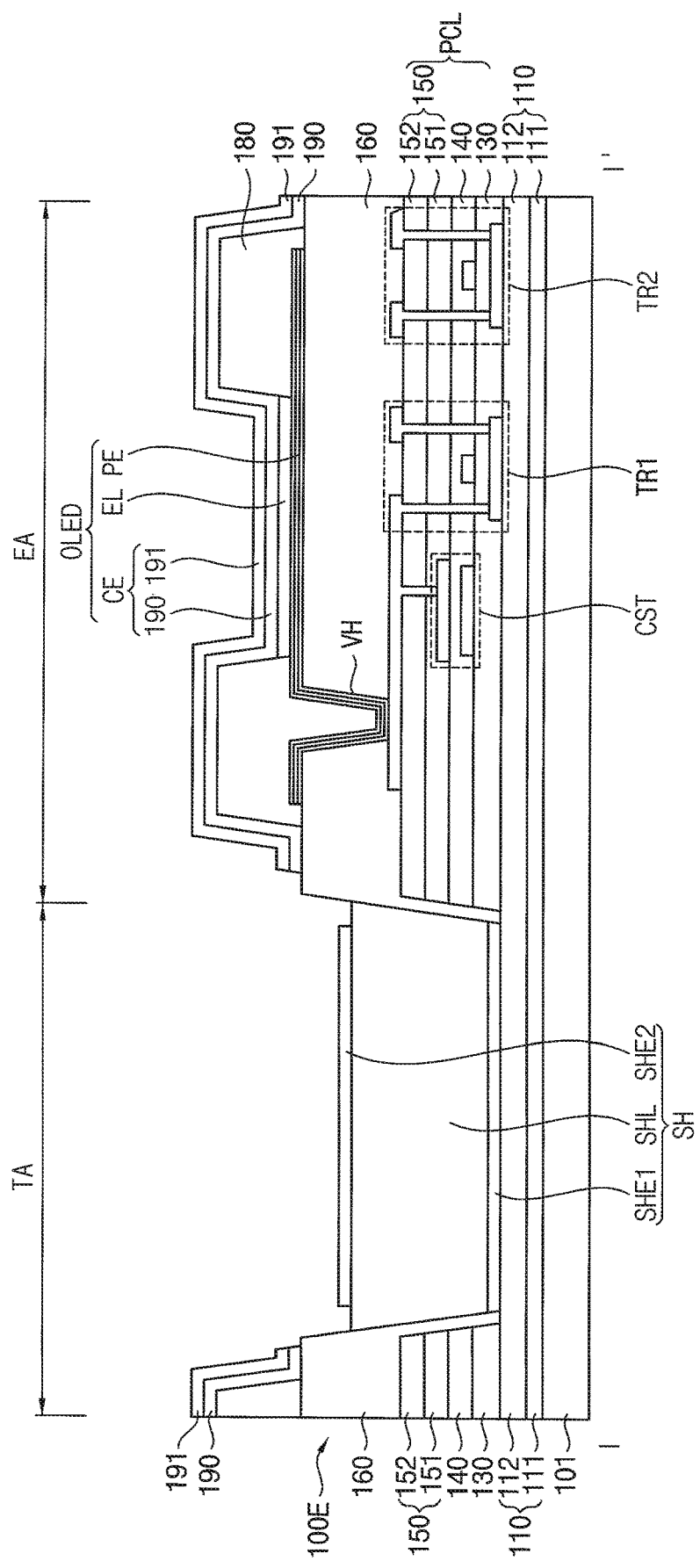
FIG. 18 is a cross-sectional view illustrating a first substrate according to an exemplary embodiment.

FIG. 18 is a cross-sectional view illustrating a first substrate according to an exemplary embodiment.

The method of manufacturing the first substrate 100E in comparison with the method of manufacturing the first substrate 100C according to the previous exemplary embodiment may include substantially similar processes as those described referring to FIG. 16. Hereinafter, the same reference numerals will be used to refer to the same or like parts as those described in the previous exemplary embodiment, and any repetitive detailed explanation may be omitted.

Referring to FIG. 18 in comparison with the first substrate 100C shown in FIG. 16, the first substrate 100E may include a second transparent conductive layer 191. The second transparent conductive layer 191 may be disposed in the emission area EA and the transmission area TA on the first base substrate 101.

The second transparent conductive layer 191 may be patterned to form a common electrode CE that includes the first and second transparent conductive layers 190 and 191 in the emission area EA, and to form the second shutter electrode SHE2 that contacts the shutter layer SHL in the transmission area TA. The second transparent conductive layer 191 may be selectively etched differently from that of the first transparent conductive layer 190.

According to the exemplary embodiment, the shutter unit SH in the transmission area TA may be driven independently from the organic light emitting diode OLED in the emission area EA. The transmission area TA of the first substrate 100E may be driven in the transparent mode and the opaque mode.

Figure 19:
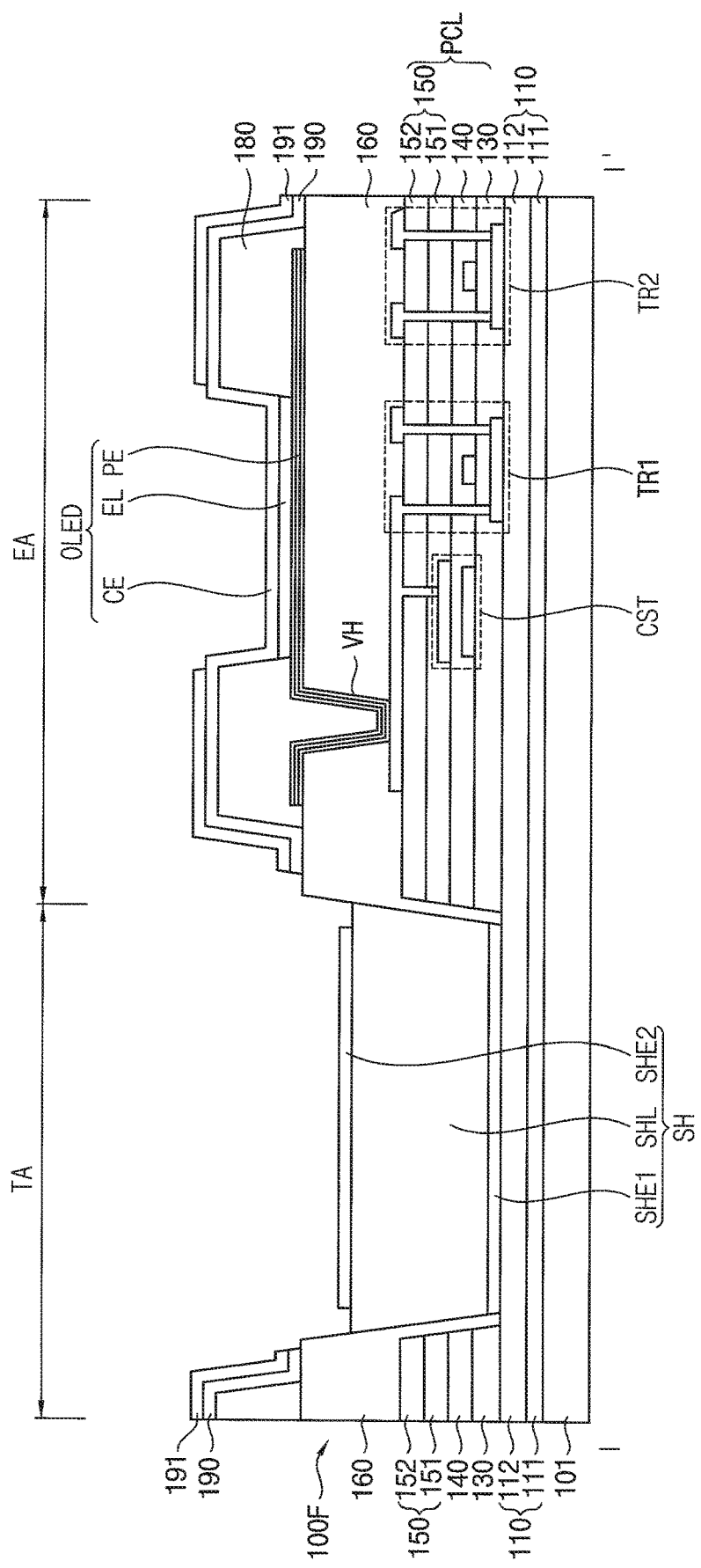
FIG. 19 is a cross-sectional view illustrating a first substrate according to an exemplary embodiment.

FIG. 19 is a cross-sectional view illustrating a first substrate according to an exemplary embodiment.

Referring to FIG. 19, the method of manufacturing the first substrate 100F in comparison with the method of manufacturing the first substrate 100C according to the previous exemplary embodiment may include substantially similar processes as those described referring to FIG. 16. Hereinafter, the same reference numerals will be used to refer to the same or like parts as those described in the previous exemplary embodiment, and any repetitive detailed explanation may be omitted.

Referring to FIG. 19 in comparison with the first substrate 100C shown in FIG. 16, the first substrate 100F may include a second transparent conductive layer 191. The second transparent conductive layer 191 may be disposed in the emission area EA and the transmission area TA on the first base substrate 101.

The second transparent conductive layer 191 may be patterned to expose a portion of the common electrode CE formed using the first transparent conductive layer 190 in the emission area EA and to form the second shutter electrode SHE2 that contacts the shutter layer SHL in the transmission area TA.

According to the exemplary embodiment, the first substrate 100F in comparison with the first substrate 100C shown in FIG. 16 and the first substrate 100D shown in FIG. 17, may include a common electrode CE of the organic light emitting diode OLED may be formed using a single transparent conductive layer to increase the transmissivity.

According to the exemplary embodiment, the shutter unit SH in the transmission area TA may be driven independently from the organic light emitting diode OLED in the emission area EA. The transmission area TA of the first substrate 100F may be driven in the transparent mode and the opaque mode.

Figure 20:
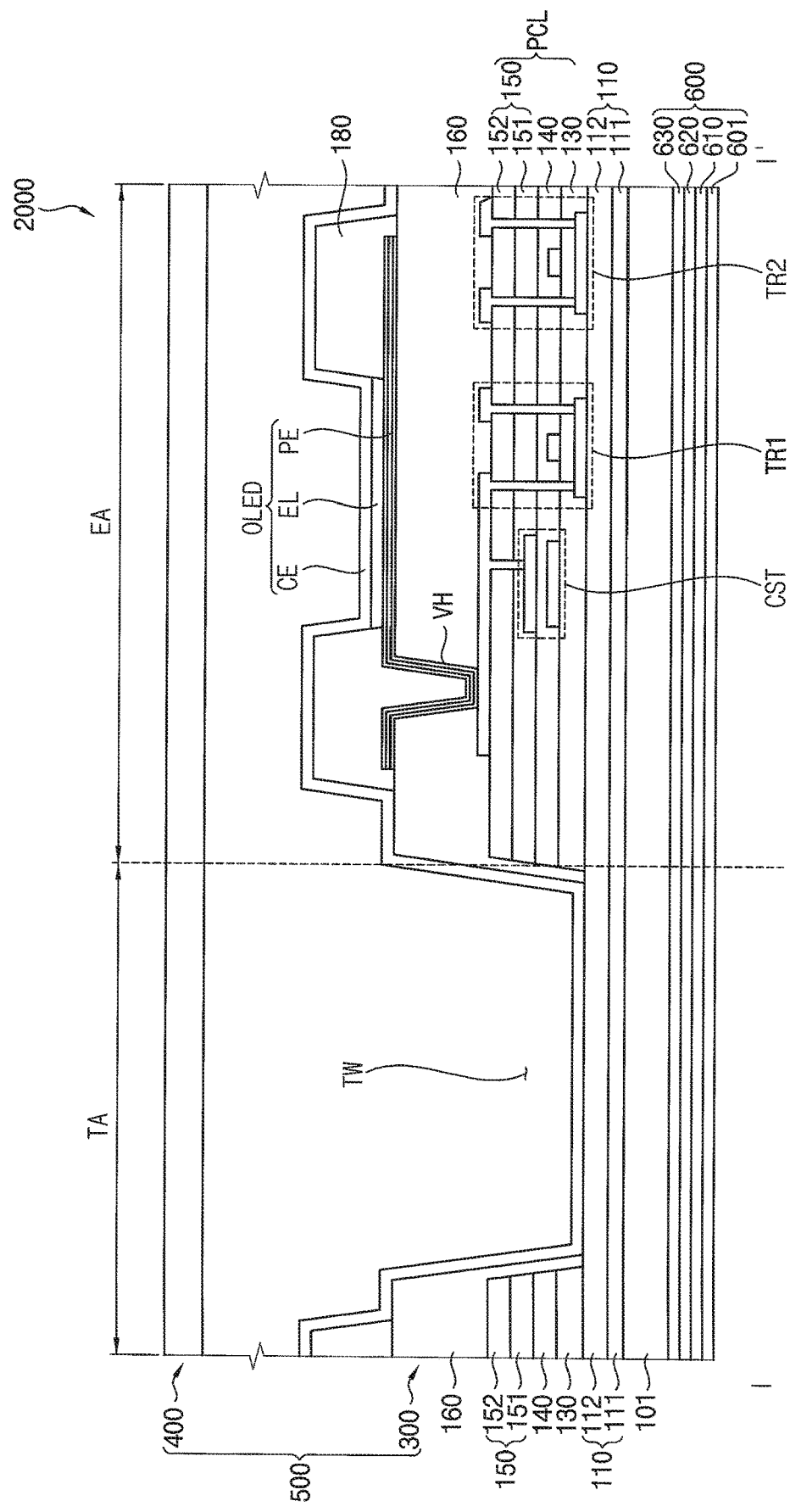
FIG. 20 is a cross-sectional view illustrating a display apparatus according to an exemplary embodiment.

FIG. 20 is a cross-sectional view illustrating a display apparatus according to an exemplary embodiment.

Hereinafter, the same reference numerals will be used to refer to the same or like parts as those described in the previous exemplary embodiment, and any repetitive detailed explanation may be simplified or omitted.

Referring to FIG. 20, the display apparatus 2000 may include a display panel 500 and a shutter film 600.

The display panel 500 may include a first substrate 300 and a second substrate 400.

The first substrate 300 may include a first base substrate 101, a buffer layer 110, a pixel circuit layer PCL, a planarization layer 160, a pixel electrode PE, a pixel defining layer 180, a light-emitting layer EL, a common electrode CE, and a shutter unit SH.

The first base substrate 101 may be formed of a transparent material.

The buffer layer 110 may be disposed on the first base substrate 101. For example, the buffer layer 110 may include a first layer 111 formed of silicon nitride (SiNx) and a second layer 112 formed of silicon oxide (SiOx).

The first base substrate 101 on which the buffer layer 110 is disposed may include an emission area EA and a transmission area TA.

The pixel circuit layer PCL, the planarization layer 160, the pixel electrode PE, the pixel defining layer 180, the light-emitting layer EL, and the common electrode CE may be disposed in the emission area EA.

The pixel circuit layer PCL may include a first transistor TR1, a second transistor TR2, and a storage capacitor CST.

The pixel circuit layer PCL may include a gate insulating layer 130, a first insulating interlayer 140 and a second insulating interlayer 150 that are disposed between the first transistor TR1, the second transistor TR2, and the storage capacitor CST. The second insulating interlayer 150 may include a first layer 151 formed of silicon oxide (SiOx) and a second layer 152 formed of silicon nitride (SiNx).

A pixel electrode PE of the organic light emitting diode OLED may be connected to the first transistor TR1 through the via-hole VH and may be disposed on the planarization layer 160 in the emission area EA.

The pixel electrode PE may be formed of metal, alloy, metal nitride, conductive metal oxide, transparent conductive material, etc., which may be used alone or in any suitable combination. The transparent conductive material may include ITO, IZO and a-IZO. For example, the pixel electrode PE may have a multi-layer structure that includes a first transparent conductive layer, a metal layer, and a second transparent conductive layer.

The light-emitting layer EL may be disposed in the OLED area ELA corresponding to the opening of the pixel defining layer 180.

The common electrode CE may be disposed in the emission area EA and the transmission area TA of the first base substrate 101 on which the light-emitting layer EL is disposed.

The transmission window TW may be defined by an opening portion that exposes a portion of the buffer layer 110 in the transmission area TA.

The second substrate 400 opposite to the first substrate 300 may be combined with the first substrate 300. The second substrate 400 may be formed of a transparent material.

The shutter film 600 may be adhered to the first substrate 300. For example, the shutter film 600 may be adhered to a rear surface of the first base substrate 101 using an adhesive member. The shutter film 600 may include a flexible substrate 601, a first shutter electrode 610, a shutter layer 620, and a second shutter electrode 630.

The flexible substrate 601 may be formed of a flexible transparent material such as a flexible transparent resin. The flexible substrate 601 may be formed of polyimide, polyethylenenaphtalate, polyethyleneterephthalate, polyarylate, polycarbonate, polyrtherlmide or polyethersulfone, etc.

The first shutter electrode 610 may be disposed on the flexible substrate 601 and formed of a transparent conductive material. The transparent conductive material may include indium tin oxide (ITO) and indium zinc oxide (IZO).

The shutter layer 620 may be disposed between the first shutter electrode 610 and the second shutter electrode 630. The shutter layer 620 may include one of an electrochromic layer, a liquid crystal layer, and an electrophoresis layer.

The second shutter electrode 630 may be disposed on the shutter layer 620 and formed of a transparent conductive material. The transparent conductive material may include indium tin oxide (ITO) and indium zinc oxide (IZO).

When same voltages are applied to the first and second shutter electrodes 610 and 630, respectively, the shutter layer 620 may transmit light, and the shutter film 600 is driven in a transparent mode. Thus, an external light may be transmitted through the transmission window TW of the first substrate. However, when different voltages are applied to the first and second shutter electrodes 610 and 630, respectively, the shutter layer 620 may block light, and the shutter film 600 is driven in an opaque mode. Thus, the external light may be blocked in the transmission window TW of the first substrate. However, the driving method of the shutter 600 is not limited thereto. For example, the shutter unit SH may be driven in the transparent mode when same voltage is applied to the first and second shutter electrodes, and the shutter unit SH may be driven in the opaque mode when different voltages are applied to the first and second shutter electrodes, respectively.

Although not shown in figures, at least one optical film may be disposed between the display panel 500 and the shutter film 600.

According to the exemplary embodiment, in an indoor environment in which intensity of the external light is relatively low, the transmission area TA of the display apparatus may be driven in the transparent mode so that the transmission area TA may transmit the external light to improve the luminance of the light emitted from the emission area EA. However, in an outdoor environment in which intensity of the external light is relatively high, the transmission area TA of the display apparatus may be driven in the opaque mode so that the transmission area TA may block the external light to prevent the external light from being mixed with the light emitted from the emission area EA. The controlled transmission and blocking of external light by controlling the shutter 600 depending on an environmental condition can improve the visibility of the image displayed on the display apparatus.

Figure 21:
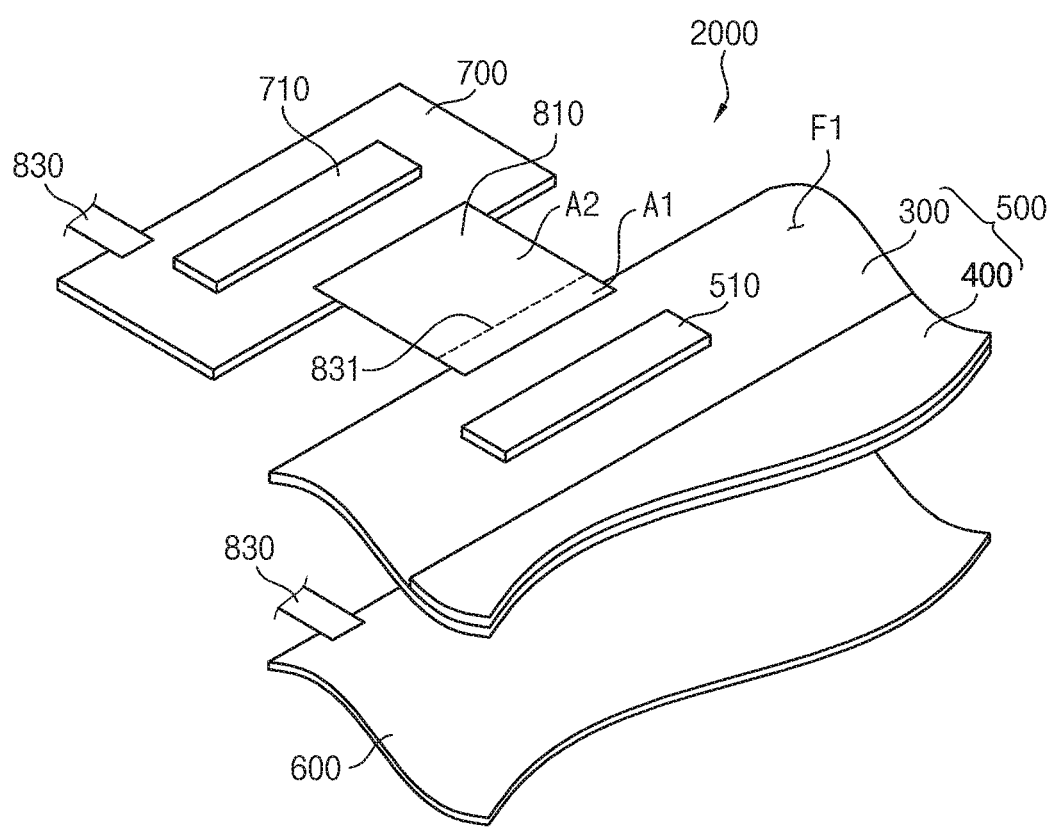
FIG. 21 is a perspective view illustrating the display apparatus shown in FIG. 20.
Figure 22:
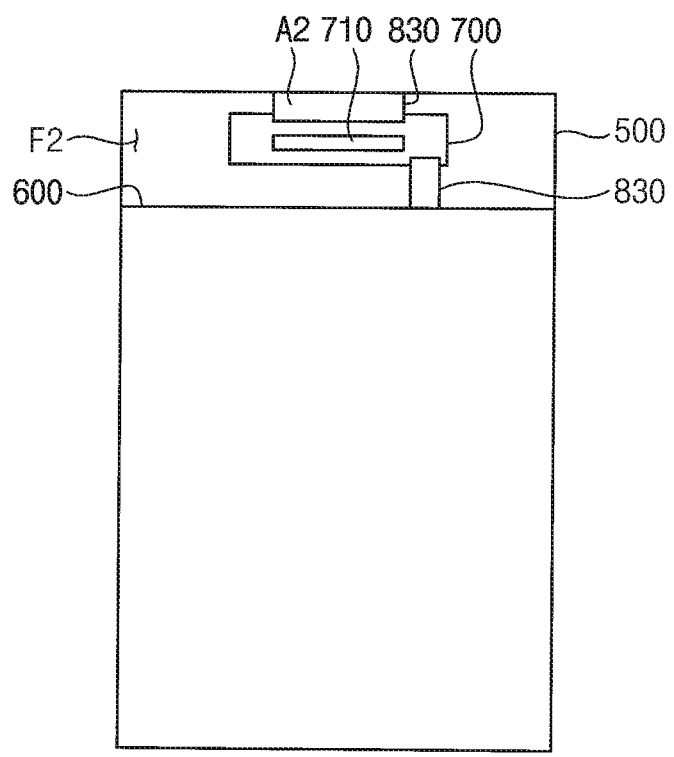
FIG. 22 is a rear view illustrating the display apparatus shown in FIG. 21.

FIG. 21 is a perspective view illustrating the display apparatus shown in FIG. 20. FIG. 22 is a rear view illustrating the display apparatus shown in FIG. 21.

Referring to FIGS. 20 to 22, the display apparatus 2000 may include a display panel 500, a shutter film 600, a printed circuit board 700, a first flexible circuit board 810, and a second flexible circuit board 830.

The display panel 500 may include a first substrate 300 and a second substrate 400. The first substrate 300 and the second substrate 400 may be substantially the same as those described in the previous exemplary embodiment shown in FIG. 20, and repetitive detailed explanation may be omitted.

The first substrate 300 may include a first surface F1 and a second surface F2 that is opposite to the first surface F1.

The display panel 500 may include a panel driving circuit 510 to drive the display panel 500. For example, the panel driving circuit 510 may be disposed on the first surface F1 of the first substrate 300. The panel driving circuit 510 is configured to generate a plurality of driving signals to drive a plurality of pixel circuits in the display panel 500 and to output the plurality of driving signals to the plurality of pixel circuits.

The shutter film 600 may be disposed on the second surface F2 of the first substrate 300. The shutter film 600 is substantially the same as those described in the previous exemplary embodiment shown in FIG. 20, and repetitive detailed explanation may be omitted.

A main driving circuit 710 may be mounted on the printed circuit board 700. The main driving circuit 710 is configured to generate a plurality of control signals for controlling the panel driving circuit 510 and a plurality of driving voltages for driving the display panel 500. The plurality of driving voltages may include a panel driving voltage to drive the display panel 500 and a shutter driving voltage to drive the shutter film 600.

The first flexible circuit board 810 may connect the display panel 500 and the printed circuit board 700. The first flexible circuit board 810 may include a folding portion 831. The first flexible circuit board 810 is configured to transfer the plurality of control signals and the panel driving voltage that is generated from the main driving circuit 710 to the panel driving circuit 510. The panel driving voltage may include an analog power source voltage that is used to generate a data voltage, a high-power source voltage and a low-power source voltage that are used to drive the organic light emitting diode OLED.

An end portion of the first flexible circuit board 810 may be mounted on the first surface F1 of the first substrate 300, and electrically connected to the panel driving circuit 510. The first flexible circuit board 810 may include a first area A1, a second area A2, and a folding portion 831 that is a boundary between the first and second areas A1 and A2. The folding portion 831 may correspond to an edge portion of the display panel 500.

The first flexible circuit board 810 can be folded at or around the folding portion 831. The first area A1 of the first flexible circuit board 810 is disposed on the first surface F1 of the first substrate 300, and the second area A2 of the first flexible circuit board 810 is disposed on the second surface F2 of the first substrate 300.

The second flexible circuit board 830 may connect the printed circuit board 700 and the shutter film 600. The second flexible circuit board 830 is configured to transfer the shutter driving voltage that is generated from the main driving circuit 710 to the shutter film 600. The shutter driving voltage may include a first shutter voltage applied to the first shutter electrode and a second shutter voltage applied to the second shutter electrode. The first and second shutter voltages may be the same as each other in a transparent mode and may be different from each other in an opaque mode.

The shutter film 600 that is connected to the printed circuit board 700 through the second flexible circuit board 830 may be disposed on the second surface F2 of the first substrate 300. According to the exemplary embodiment, the display panel 500 and the shutter film 600 may share the printed circuit board 700 on which the main driving circuit 710 is mounted to simplify the assembly process of the display apparatus.

Figure 23:
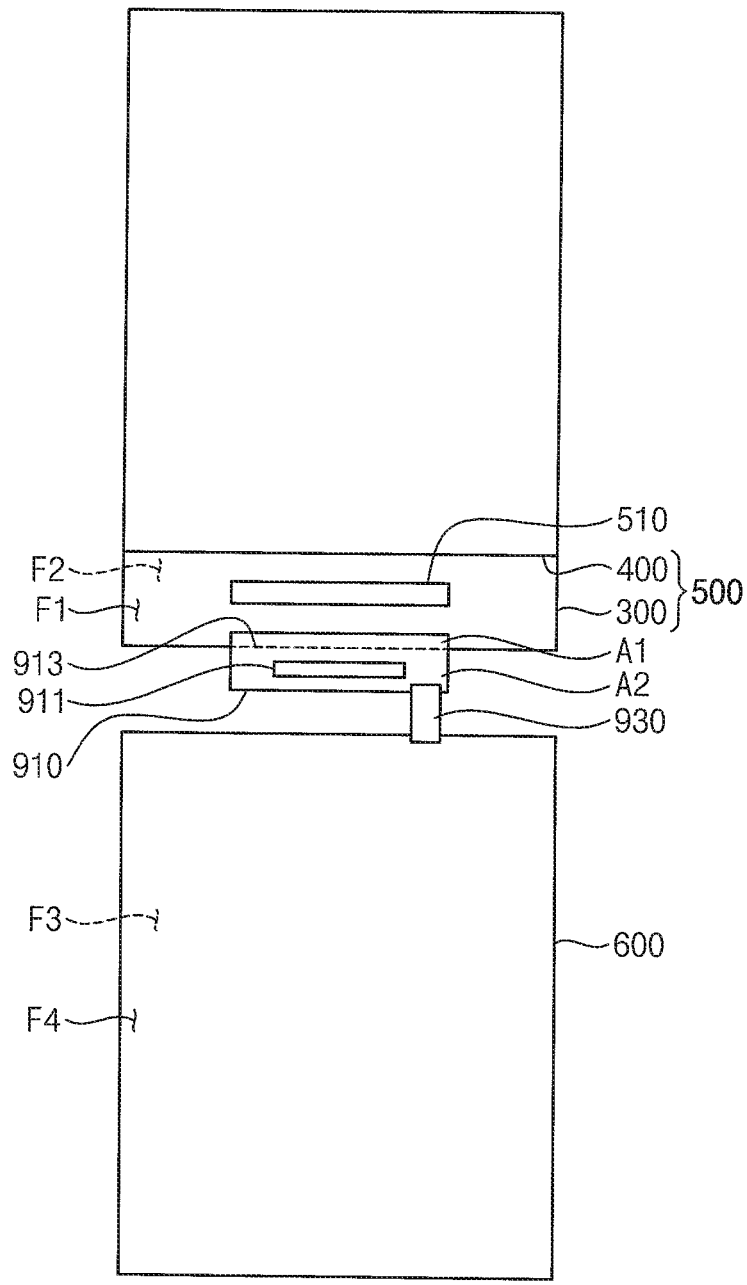
FIG. 23 is a conceptual diagram illustrating a display apparatus according to an exemplary embodiment.
Figure 24:
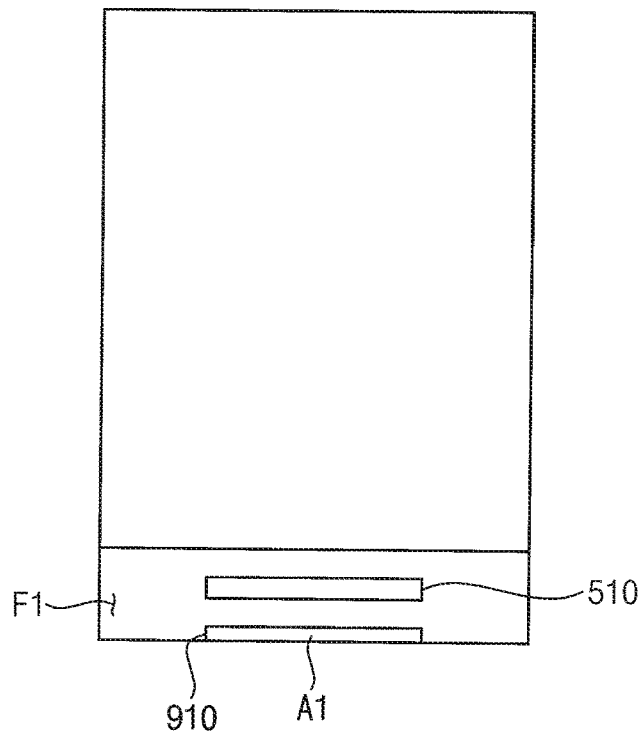
FIG. 24 is a front view illustrating the display apparatus shown in FIG. 23.
Figure 25:
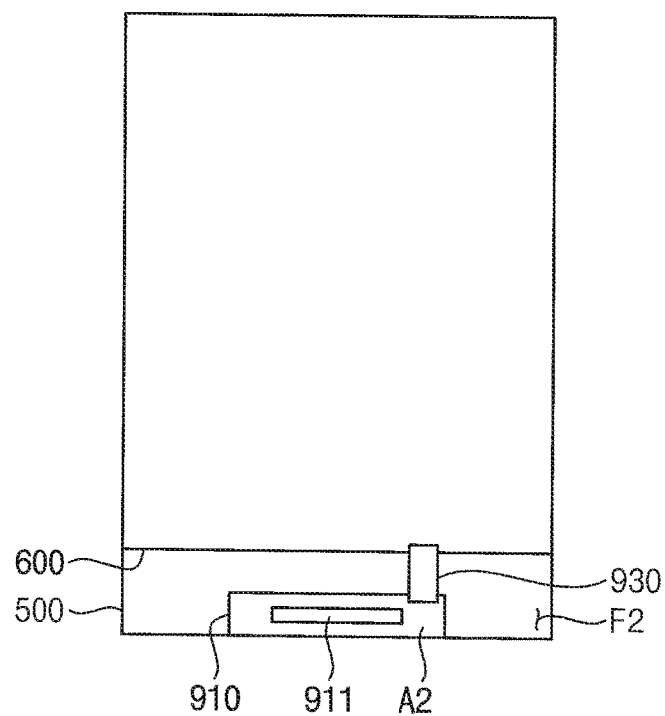
FIG. 25 is a rear view illustrating the display apparatus shown in FIG. 23.

FIG. 23 is a conceptual diagram illustrating a display apparatus according to an exemplary embodiment. FIG. 24 is a front view illustrating the display apparatus shown in FIG. 23. FIG. 25 is a rear view illustrating the display apparatus shown in FIG. 23.

Referring to FIG. 23, the display apparatus 3000 may include a display panel 500, a shutter film 600, a first flexible circuit board 910 and a second flexible circuit board 930.

The display panel 500 may include a first substrate 300 and a second substrate 400. The first substrate 300 and the second substrate 400 may be substantially the same as those described in the previous exemplary embodiment shown in FIGS. 20 and 21, and repetitive detailed explanation may be omitted. The first substrate 300 may include a first surface F1 and a second surface F2 that is opposite to the first surface F1.

The panel driving circuit 510 may be disposed on the first surface F1 of the first substrate 300. The panel driving circuit 510 is configured to generate a plurality of driving signals to drive a plurality of pixel circuits in the display panel 500 and to output the plurality of driving signals to the plurality of pixel circuits.

The shutter film 600 may include a third surface F3 that adheres to the second surface F2 of the first substrate 300 and a fourth surface F4 that is opposite to the third surface F3. The shutter film 600 may be substantially the same as those described in the previous exemplary embodiment shown in FIGS. 20 and 21, and repetitive detailed explanation may be omitted.

The first flexible circuit board 910 may be mounted on a first surface F1 of the first substrate 300, and electrically connected to the panel driving circuit 510. The first flexible circuit board 910 may include a first area A1, a second area A2, and a folding portion 913 that is a boundary between the first and second areas A1 and A2. The folding portion 913 may correspond to an edge portion of the display panel 500.

The first flexible circuit board 910 can be folded at the folding portion 913. The first area A1 of the first flexible circuit board 910 is disposed on the first surface F1 of the first substrate 300, and the second area A2 of the first flexible circuit board 910 is disposed on the second surface F2 of the first substrate 300.

The main driving circuit 911 may be mounted on the first flexible circuit board 910.

The main driving circuit 911 is configured to generate a plurality of control signals for controlling the panel driving circuit 510 and a plurality of driving voltages for driving the display panel 500. The plurality of driving voltages may include a panel driving voltage to drive the display panel 500 and a shutter driving voltage to drive the shutter film 600. The panel driving voltage may include an analog power source voltage that is used to generate a data voltage, a high-power source voltage and a low-power source voltage that are used to drive the organic light emitting diode OLED. The shutter driving voltage may include a first shutter voltage applied to the first shutter electrode and a second shutter voltage applied to the second shutter electrode. The first and second shutter voltages may be the same as each other in a transparent mode and may be different from each other in an opaque mode.

The second flexible circuit board 930 may connect the shutter film 600 and the first flexible circuit board 910. A first end portion of the second flexible circuit board 930 may be mounted on the first flexible circuit board 910, and a second end portion of the second flexible circuit board 930 may be mounted on at least one of the third and fourth surfaces F3 and F4 of the shutter film 600.

The second flexible circuit board 930 is configured to transfer the shutter driving voltage that is generated from the main driving circuit 911 to the shutter film 600.

Referring to FIGS. 24 and 25, an end portion of the first flexible circuit board 910 is mounted on the first surface F1 of the first substrate 300, and the first flexible circuit board 910 can be folded at the folding portion 913. Thus, the first area A1 of the first flexible circuit board 910 is disposed on the first surface F1 of the first substrate 300, and the second area A2 of the first flexible circuit board 910 is disposed on the second surface F2 of the first substrate 300.

The shutter film 600 that is connected to the printed circuit board 700 through the second flexible circuit board 930 may be disposed on the second surface F2 of the first substrate 300.

According to the exemplary embodiment, the display panel 500 and the shutter film 600 may share the first flexible circuit board 910 on which the main driving circuit 911 is mounted to simplify the assembly process of the display apparatus.

According to the exemplary embodiments, in an indoor environment in which intensity of the external light is relatively low, the transmission area of the display apparatus may be driven in the transparent mode so that the transmission area may transmit the external light to improve the luminance of the light emitted from the emission area. However, in an outdoor environment in which intensity of the external light is relatively high, the transmission area of the display apparatus may be driven in the opaque mode so that the transmission area may block the external light to prevent the external light from being mixed with the light emitted from the emission area to increase the visibility of the image displayed on the display apparatus.

The present inventive concept may be applied to a display device and an electronic device having the display device. For example, the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The foregoing is illustrative of the inventive concept and should not be construed as limiting thereof. Although exemplary embodiments of the inventive concept have been described, those skilled in the art will readily appreciate that many variations and modifications are possible in the exemplary embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. A display apparatus comprising:
    a display panel comprising a first substrate and a second substrate opposing to the first substrate, wherein the display panel has a first surface and a second surface and comprises a transmission area transmitting a light and an emission area in which a pixel circuit and an organic light emitting diode that is connected to the pixel circuit are disposed;
    a shutter film comprising a first shutter electrode, a second shutter electrode, and a shutter layer disposed between the first and second shutter electrodes and disposed on a second surface of the first substrate;
    a main driving circuit configured to generate a panel driving voltage to drive the display panel and a shutter driving voltage to drive the shutter film;
    a first flexible circuit board comprising a first area that is disposed on a first surface of the first substrate and a second area that is disposed on the second surface of the first substrate, and configured to transfer the panel driving voltage to the display panel; and
    a second flexible circuit board connected to the first flexible circuit board and the shutter film, and configured to transfer the shutter driving voltage to the shutter film.

2. The display apparatus of claim 1, further comprising:
    a printed circuit board on which the main driving circuit is mounted and disposed on the second surface of the first substrate,
    wherein the first flexible circuit board connects the printed circuit board and the display panel, and the second flexible circuit board connects the printed circuit board and the shutter film.

3. The display apparatus of claim 1, wherein the main driving circuit is mounted on the first flexible circuit board, a first end portion of the first flexible circuit board is connected to the display panel, and a second end portion of the first flexible circuit board is connected to the first flexible circuit board.

* * * * *